(12) United States Patent
Song et al.

(10) Patent No.: US 8,176,383 B2
(45) Date of Patent: May 8, 2012

(54) METHOD OF CONSTRUCTING LOW DENSITY PARITY CHECK CODE, METHOD OF DECODING THE SAME AND TRANSMISSION SYSTEM FOR THE SAME

(75) Inventors: Huishi Song, Beijing (CN); Wen Chen, Beijing (CN); Hongbing Shen, Beijing (CN); Qinghua Yang, Beijing (CN)

(73) Assignee: TIMI Technologies Co., Ltd., Beijing (CN)

(*) Notice: Subject to any disclaimer, the term of this patent is extended or adjusted under 35 U.S.C. 154(b) by 861 days.

(21) Appl. No.: 12/226,808

(22) PCT Filed: Nov. 14, 2006

(86) PCT No.: PCT/CN2006/003050
§ 371 (c)(1),
(2), (4) Date: Oct. 29, 2008

(87) PCT Pub. No.: WO2007/124627
PCT Pub. Date: Nov. 8, 2007

(65) Prior Publication Data
US 2009/0100311 A1    Apr. 16, 2009

(30) Foreign Application Priority Data
Apr. 29, 2006 (CN) .......................... 2006 1 0079056

(51) Int. Cl.
*G06F 11/00* (2006.01)
(52) U.S. Cl. ....................... 714/758; 714/755
(58) Field of Classification Search .......... 714/755, 714/752, 780, 758, 759, 767, 772, 756
See application file for complete search history.

(56) References Cited

U.S. PATENT DOCUMENTS

| | | | |
|---|---|---|---|
| 7,178,082 B2* | 2/2007 | Yu et al. | 714/752 |
| 7,716,561 B2* | 5/2010 | Belogolovyi et al. | 714/780 |
| 2004/0019845 A1 | 1/2004 | Eroz et al. | |
| 2004/0034828 A1* | 2/2004 | Hocevar | 714/800 |
| 2004/0255217 A1* | 12/2004 | Garrett et al. | 714/746 |
| 2005/0166133 A1 | 7/2005 | Eroz et al. | |
| 2005/0268204 A1 | 12/2005 | Harada | |
| 2005/0271160 A1 | 12/2005 | Eroz et al. | |
| 2006/0005104 A1 | 1/2006 | Harada | |
| 2006/0053359 A1 | 3/2006 | Chae et al. | |
| 2008/0086670 A1* | 4/2008 | Krouk et al. | 714/752 |

FOREIGN PATENT DOCUMENTS

| | | |
|---|---|---|
| CN | 1481130 A | 3/2004 |
| CN | 1705237 A | 12/2005 |
| CN | 1713531 A | 12/2005 |
| CN | 1739244 A | 2/2006 |
| EP | 1 589 663 A1 | 10/2005 |

* cited by examiner

*Primary Examiner* — Dieu-Minh Le
(74) *Attorney, Agent, or Firm* — Morgan, Lewis, Bockius LLP

(57) ABSTRACT

The present invention relates to a method of constructing a low density Parity Check code, a method of decoding the same and a transmission system using the same. The method comprises steps of: constructing a low density Parity Check matrix of the low density Parity Check code by using a fixed pattern; blocking data sent from an information source (101), encoding the data by directly or indirectly using the constructed low density Parity Check matrix to obtain codewords of the low density Parity Check code; and outputting the codewords of the low density Parity Check code. The low density Parity Check code can be encoded by using the Parity Check matrix or a generation matrix. According to the proposed constructing method, a Parity Check matrix of a low density Parity Check code having excellent performance, a method of constructing the low density Parity Check code and a complexity-reduced decoding method can be obtained.

57 Claims, 16 Drawing Sheets

Parity Matrix Example 600

$$H = \begin{bmatrix} 1 & 0 & 1 & 0 & 1 & 0 & 1 & 0 \\ 0 & 1 & 0 & 1 & 0 & 1 & 0 & 1 \\ 1 & 0 & 0 & 1 & 1 & 0 & 0 & 1 \\ 0 & 1 & 1 & 0 & 0 & 1 & 1 & 0 \end{bmatrix} \begin{matrix} c_0 \\ c_1 \\ c_2 \\ c_3 \end{matrix}$$

with columns labeled $V_0, V_1, V_2, V_3, V_4, V_5, V_6, V_7$

Triangle Matrixes 1000

FIG.10

Special Triangle Matrixes 1100

Set of fixed patterns 1400

1401 Fixed pattern

1402 Fixed pattern

1403 Fixed pattern

1404 Fixed pattern

1405 Fixed pattern

1406 Fixed pattern

1407 Fixed pattern

1408 Fixed pattern

1409 Fixed pattern

1410 Fixed pattern

1411 Fixed pattern

1412 Fixed pattern

METHOD OF CONSTRUCTING LOW DENSITY PARITY CHECK CODE, METHOD OF DECODING THE SAME AND TRANSMISSION SYSTEM FOR THE SAME

TECHNICAL FIELD

The present invention generally relates to a low density Parity Check codes, and more particularly, to a method of constructing a low density Parity Check codes, a method of decoding the low density Parity Check codes, and a transmission system using the low density Parity Check codes.

BACKGROUND

In 1948, Claude Shannon initially proposed his famous "noisy channel coding theorem" which firstly gives the maximum transmission rate of the noisy channel information, i.e., channel capacity. Simultaneously, Shannon also derived the ultimate limited transmission capability of the noisy channel, i.e., the minimum Signal-to-Noise Ratio required by errorless information transmission, which is also called as the Shannon limit. The Shannon limit is an important indication for evaluating capability of the channel forward error correcting codes. The closer is the performance curve of the forward error correction (FEC) to the Shannon limit, the more excellent is the FEC performance. Otherwise, the performance is worse.

The Low Density Parity Check code (LDPC) is one kind of excellent channel error correction encoding scheme which may approach the Shannon's limit. The LDPC code is a special linear parity block code, whose parity-check matrix is "sparse": there is only very few non-zero elements (for the binary code, non-zero element is 1), and the remaining elements are all zero. In 1960, Robert Gallager firstly proposed the concept of LDPC code in his Ph.D. dissertation and also suggested two iterative decoding algorithms, that is why the LDPC code is also called as Gallager code. Gallager indicated, in theory, that the LDPC code may approach the channel capacity with low complexity by using iterative decoding algorithms (or message delivering algorithms). This is a great invention, but in the following 30 years, researchers did not pay enough attention on it.

From the current viewpoint, one reasons why the LDPC code was ignored might consist in that the technique of the software and hardware of the computers were very low at that time, and thus the researchers could not know the excellent performance of the LDPC code from computer simulations; as another reason, the LDPC code needs a larger storage space which could not be born at that time. Additionally, at that time, other codes such as Reed-Solomon code and Hamming code were available, which might be used temporarily as channel encoding schemes, and thus the researchers did not intently forward their reaches onto the LDPC code.

Even at this time, if it is intended to apply the LDPC code into the actual communication systems, the LDPC code still needs to be carefully studied and designed. Since the actual communication systems additionally put some special requirements on the LDPC code, such as codec hardware schemes having lower complexity, excellent error correction performance, and the like, besides the deep studies on the encoding/decoding method, it is also required to specially limit the construction of the Parity Check matrix of the LDPC code. Generally, there are two methods of constructing the Parity Check matrix of the LDPC code: one is to firstly set some attribute limitations on the Parity Check matrix such as minimum girth or node degree distribution and then randomly or pseudo-randomly generate the Parity Check matrix by using the computer searching methods; the other is to construct the parity-check matrix of the LDPC code by using the mathematical formulae to make it have regular structure. However, neither of these two methods can provide satisfactory error correction performance and lower complexity.

SUMMARY OF INVENTION

The object of the present invention is to solve one of the above problems so as to provide a Low Density Parity Check code (LDPC) having excellent error correction performance and requiring lower codec hardware complexity. To this end, the present invention provide a method of constructing a low density Parity Check code, a method of decoding the LDPC, and a kind of transmission systems using the LDPC code.

The above-mentioned excellent, error correction performance means that the limit of the error correction performance of the LDPC code very approaches the Shannon's limit, and the error floor is very low. The above-mentioned lower complexity means that when the encoder and decoder of the LDPC code are implemented in hardware, the hardware resource consuming (such as the storage spaces and the logic units) is very small on the premise of fulfilling the operation speed. The mentioned hardware includes Field Programmable Gate Array (FPGA) and Application Specific Integrated Circuit (ASIC) etc.

One key parameter representing the error correction performance of the channel encoding scheme is the minimum distance. For the LDPC code, the minimum girth may represent the error correction performance of the LDPC code to some extent. The concept of the minimum girth of a code will be described in the Detailed Description of Preferred Implementations.

A low density Parity Check matrix can completely represent the LDPC code. Thus, the construction of the LDPC code is equivalent to the construction of the low density Parity Check matrix corresponding to the LDPC code. The above-mentioned low density Parity Check matrix means that the Parity Check matrix is "sparse": there is only very few non-zero elements (for the binary code, non-zero element is 1), and the remaining elements are all zero.

In order to achieve the above objects, an aspect of the present invention consists in a method of constructing a low density Parity Check code, comprising: constructing a low density Parity Check matrix of the low density Parity Check code by using a fixed pattern; blocking data sent from an information source, encoding the data by directly or indirectly using the constructed low density Parity Check matrix to obtain codewords of the low density Parity Check code; and outputting the words of the low density Parity Check code.

Another aspect of the present invention consists in a method of decoding a Parity Check code, comprising: calculating a metric value corresponding to each bit according to the constellation mapping scheme; blocking the metric values; regenerating, in real-time, a low density Parity Check matrix of a low density Parity Check code, which is also used by a transmitter, the low density Parity Check matrix may be a Parity Check matrix generated by using a fixed pattern; performing a iterative decoding operation of the low density Parity Check code in an iterated manner by using the blocked metric values and the regenerated Parity Check matrix to obtain hard-decision data corresponding to data from an information source of the transmitter; and outputting the hard-decision data.

Still another aspect of the present invention consists in a transmission system using a low density Parity Check codes, the transmission system comprising a transmitting apparatus and a receiving apparatus, wherein the transmitting apparatus includes: means for firstly inputting data sent from an information source into a low density Parity Check code encoder for encoding, the encoder may be an encoder using a low density Parity Check code constructed by using a fixed pattern; means for delivering the data into a randomizer for randomizing; means for delivering the data into an interleaver for interleaving; and means for delivering the data through a modulator to transmit the data in air.

Still yet another aspect of the present invention consists in a transmission system using a low density Parity Check codes, the transmission system comprising a transmitting apparatus and a receiving apparatus, wherein the receiving apparatus includes: means for receiving a radio-frequency signal in the air, performing down-conversion and filtering, and obtaining a baseband signal; means for delivering the baseband signal into a synchronizer to obtain a start position of the synchronization; means for intercepting data based on the start position of the synchronization, and performing operations including channel estimation and demodulation which are finished in a demodulator; means for delivering the output data into a de-interleaver to perform a de-interleaving operation; means for delivering the output data into a de-randomizer to perform a de-randomizing operation; means for delivering the output data into a low density Parity Check code decoder for decoding; and means for delivering the decoded data to a signal sink.

The inventive low density Parity Check code constructing method and transmission system skillfully combine the two conventional methods in the prior arts. According to the proposed constructing method, a Parity Check matrix of a low density Parity Check code having excellent performance, a method of constructing the low density Parity Check code, and a decoding method having lower complexity can be obtained.

BRIEF DESCRIPTION OF DRAWINGS

The present invention is described but not limited in conjunction with the embodiments shown in the drawings throughout which the similar reference numbers represent the similar elements, in which:

FIG. 10 is an example of the triangle matrices usable for the Parity Check matrix;

DETAILED DESCRIPTION OF PREFERRED EMBODIMENTS

Figure 1:
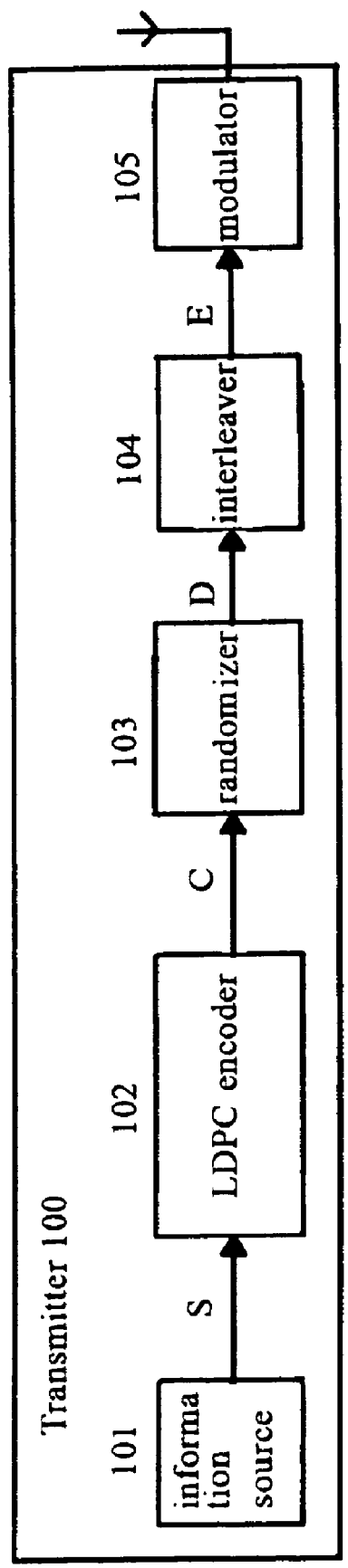
FIG. 1 is an example of a transmitter according to an embodiment of the present invention, in which the transmitter of this embodiment uses the Low Density Parity Check code (LDPC)

Hereunder, the method of constructing the LDPC code and the method of decoding the Parity Check code according to the present invention will be described in details.
Encoding Method:

a low density Parity Check matrix of the low density Parity Check code is firstly constructed: data sent from an information source (101) are blocked and encoded by directly or indirectly using the constructed low density Parity Check matrix to obtain codewords of the low density Parity Check code; and the codewords of the low density Parity Check code are outputted.

The proposed method of constructing the LDPC code uses a fixed pattern to construct the Parity Check matrix. Once the Parity Check matrix is obtained, the LDPC code is also obtained. The Parity Check matrix of the LDPC code is denoted by H, and thus the matrix H according to the present invention can be represented as:

$$H=[A|B] \quad (1)$$

wherein A and B are respectively the left and right sub matrices of the Parity Check matrix H, the numbers of columns thereof are respectively denoted as $N_l$ and $N_r$, the numbers of rows thereof are both M, and $N=N_l+N_r$ denotes the number of columns of the matrix H. $K=N-M$ represents the number of information bits of the LDPC code.

The sub matrix A or B may be an empty matrix, and at most one of the sub matrices may be an empty matrix. When the sub matrix A or B is an empty matrix, the Parity Check matrix H actually includes only one sub matrix (B or A) which is called as a fixed pattern sub matrix. When neither of the two sub matrices A and B is an empty matrix, one sub matrix (A or B) is limited into a square matrix; and since the LDPC code in the present invention is a system code, the sub matrix is limited to correspond to a parity bit sequence; the other sub matrix (B or A) is called as the fixed pattern sub matrix and corresponds to the information bit sequence. Alternatively, after the column exchange is performed for the Parity Check matrix H, it is newly divided into the sub matrices A and B, one of which corresponds to the parity bit sequence and the other of which corresponds to the information bit sequence.

The sub matrix corresponding to the parity bit sequence can further be various triangle matrices or some special triangle matrices, which facilitates the particular embodiment of the encoder. Hereunder, the procedure of constructing the fixed pattern sub matrix will be described.

After the fixed pattern sub matrix is constructed, it is further combined with another sub matrix so as to constitute the Parity Check matrix H of the LDPC code. Before the Parity Check matrix H of the LDPC code is constructed, degree distribution of variable nodes and check nodes of the LDPC code shall be determined in advance, which facilitate the improvement of the error correction performance of the LDPC code. The concepts of the variable nodes and check nodes will be introduced in the preferred embodiments.

Constructing the fixed pattern sub matrix and thereby constructing the low density Parity Check code comprises:

a first step (1501) of setting the numbers of rows and columns of the fixed pattern sub matrix;

a second step (1502) of selecting a proper fixed pattern from a fixed pattern set (1400) to construct the fixed pattern sub matrix;

a third step (1503) of setting the number and size of small matrices (1201) in the fixed pattern;

a fourth step (1504) of judging whether the number and size of the small matrices (1201) are both positive integers; if so, performing a fifth step, and otherwise, going to the second step;

a fifth step (1505) of respectively setting weights of respective small matrices;

a sixth step (1506) of respectively and randomly generating, in each small matrix, non-zero elements having the number equal to the weight of the current small matrix, based on the weights of respective small matrices, these non-zero elements being in one row or one column;

a seventh step (1507) of performing non-zero element expansion to obtain an expanded fixed pattern sub matrix;

an eighth step (1508) of combining another predetermined sub matrix and the expanded fixed pattern sub matrix to construct a Parity Check matrix;

a ninth step (1509) of evaluating an attribute of a low density Parity Check code corresponding to the Parity Check matrix; and a tenth step (1510) of judging whether the attribute of the low density Parity Check code fulfills criteria or not; if so, completing the construction procedure of the low density Parity Check code, and otherwise, going to the second step.

In which, the first step may be further explained as that the numbers of rows and columns of the fixed pattern sub matrix are set based on a code rate and a code length of the LDPC code as well as the another sub matrix of the Parity Check matrix (empty matrix or square matrix). In the second step, rules for selecting the proper fixed pattern to construct the fixed pattern sub matrix include requirements on degree distribution of variable nodes and/or check nodes, requirements on a ratio of the number of rows to the number of columns of the fixed pattern sub matrix, and requirements on saving storage spaces of a decoder 305; in which one method of saving the storage spaces is to set the sizes of the small matrices (1201) into powers of 2.

A weight of a certain small matrix is represented as $WT_i$. The weight of the small matrix as defined in the present invention is that there is at least one row or column in the small matrix where there are $WT_i$ non-zero elements (for the binary code, there are $WT_i$ "1". elements) in this row or column. The weights of different small matrices may be equal or not. The weights of some small matrices may be larger than or equal to 0. A rule for determining the weights of the small matrices is requirements on degree distribution of variable nodes and check nodes. That is to say, the selection of the fixed pattern and the setting of the weights of the small matrices both use the degree distribution of the variable nodes and the check nodes.

The sixth step may be further explained as that if a weight of a certain small matrix is set into $WT_i$, then one row or column is randomly selected in this small matrix and then $WT_i$ positions are randomly selected in this row or column (i.e., correspondingly, $WT_i$ columns or rows). These final selected positions in the matrix (the intersections of the rows and columns) will be the positions of the non-zero elements. In a simplified mode, a semi-random manner can be used, i.e., a row or column position is fixed in advance, and then a corresponding column or row position is randomly selected.

A size of a small matrix is represented as L rows by L columns. A non-zero element expansion is defined as to expand one non-zero element into L non-zero elements, i.e., L−1 non-zero elements are newly added. For the binary code, that means to expand one "1" element into L "1" elements. The non-zero element expansion includes small matrix inner expansion and small matrix outer expansion. The small matrix inner expansion indicates that all the expanded non-zero elements must still be located within the small matrix; whereas the small matrix outer expansion indicates that the expanded non-zero elements may be located outside the small matrix.

In order to obtain an excellent LDPC code, a rule for expanding the non-zero elements is to "inflate" all the expanded non-zero elements as much as possible, i.e., among all the non-zero elements, any two of them are not located within one row or one column, and have a distance as large as possible. However, the skillfully designed distances among the non-zero elements may improve other attributes of the LDPC code, such as error floor.

The methods for expanding the non-zero elements include a column expansion mode, a row expansion mode and a hybrid expansion mode. The column expansion mode indicates that the maximum distance in the vertical direction between any two non-zero elements among the L expanded non-zero elements is larger than or equal to the maximum distance in the horizontal direction between any two non-zero elements. The row expansion mode indicates that the maximum distance in the horizontal direction between any two non-zero elements among the L expanded non-zero elements is larger than or equal to the maximum distance in the vertical direction between any two non-zero elements. The hybrid expansion mode indicates that the non-zero elements are expanded by using both the column expansion mode and row expansion mode. It is noted that the above distance is defined as a horizontal distance or a vertical distance. Thus, if the small matrix inner expansion is employed, the distance in the row expansion mode is equal to that in the column expansion mode.

Hereunder, some methods for expanding non-zero elements are provided. A position of a non-zero element in the H matrix is denoted as $(i_0, j_0)$ in which $i_0$ and $j_0$ are both counted from 0.

Expansion Method 1: Small Matrix Inner Expansion

Column positions of the remaining L−1 non-zero elements in the H matrix are $\lfloor j_0/L \rfloor \times L + (j_0 \% L + 1) \% L$, $\lfloor j_0/L \rfloor \times L + (j_0 \% L + 2) \% L$, ..., $\lfloor j_0/L \rfloor \times L + (j_0 \% L + L - 1) \% L$, and correspondingly, row positions are $\lfloor i_0/L \rfloor \times L + (i_0 \% L + 1) \% L$, $\lfloor i_0/L \rfloor \times L + (i_0 \% L + 2) \% L$, ..., $\lfloor i_0/L \rfloor \times L + (i_0 \% L + L - 1) \% L$, in which the symbol % denotes a module operation.

Expansion Method 2: Small Matrix Inner Expansion

Column positions of the remaining L−1 non-zero elements in the H matrix are $\lfloor j_0/L \rfloor \times L+(j_0 \% L+1) \% L$, $\lfloor j_0/L \rfloor \times L+(j_0 \% L+2) \% L, \ldots, \lfloor j_0/L \rfloor \times L+(j_0 \% L+L-1) \% L$, and correspondingly, row positions are $\lfloor i_0/L \rfloor \times L+(i_0 \% L-1) \% L$, $\lfloor i_0/L \rfloor \times L+(i_0 \% L-2) \% L, \ldots, \lfloor i_0/L \rfloor \times L+(i_0 \% L-L+1) \% L$.

Expansion Method 3: Small Matrix Outer Expansion and Column Expansion

Column positions of the remaining L−1 non-zero elements in the H matrix are $\lfloor j_0/L \rfloor \times L+(j_0 \% L+1) \% L$, $\lfloor j_0/L \rfloor \times L+(j_0 \% L+2) \% L, \ldots, \lfloor j_0/L \rfloor \times L+(j_0 \% L+L-1) \% L$, or the column positions are $(j_0+q) \% Q$, $(j_0+2\times q) \% Q, \ldots, (j_0+(L-1)\times q) \% Q$, and correspondingly, row positions are $(i_0+p) \% M$, $(i_0+2\times p) \% M, \ldots, (i_0+(L-1)\times p) \% M$, in which $1 \leq p \leq M/L$, and p is an integer; $2 \leq q \leq Q/L$, and q is an integer; and Q equals to N or K.

Expansion Method 4: Small Matrix Outer Expansion and Column Expansion

Column positions of the remaining L−1 non-zero elements in the H matrix are $\lfloor j_0/L \rfloor \times L+(j_0 \% L+1) \% L$, $\lfloor j_0/L \rfloor \times L+(j_0 \% L+2) \% L, \ldots, \lfloor j_0/L \rfloor \times L+(j_0 \% L+L-1) \% L$, or the column positions are $(j_0+q) \% Q$, $(j_0+2\times q) \% Q, \ldots, (j_0+(L-1)\times q) \% Q$, and correspondingly, row positions are $(i_0-p) \% M$, $(i_0-2\times p) \% M, \ldots, (i_0-(L-1)\times p) \% M$, in which $1 \leq p \leq M/L$, and p is an integer; $2 \leq q \leq Q/L$, and q is an integer; and Q equals to N or K.

Expansion Method 5: Small Matrix Outer Expansion and Column Expansion

Column positions of the remaining L−1 non-zero elements in the H matrix are $\lfloor j_0/L \rfloor \times L+(j_0 \% L+1) \% L$, $\lfloor j_0/L \rfloor \times L+(j_0 \% L+2\% L, \ldots, \lfloor j_0/L \rfloor \times L+(j_0 \% L+L-1) \% L$, or the column positions are $(j_0+q) \% Q$, $(j_0+2\times q) \% Q, \ldots, (j_0+(L-1)\times q) \% Q$, and correspondingly, row positions are $\{i_0 \% L+\lfloor 1/P \rfloor \times P+L\times [(1+\lfloor i_0/L \rfloor) \% P]\} \% M$, $\{i_0 \% L+\lfloor 2/P \rfloor \times P+L\times [(2\lfloor i_0/L \rfloor) \% P]\} \% M, \ldots, \{i_0 \% L+\lfloor (L-1)/P \rfloor \times P+L\times [(L-1+\lfloor i_0/L \rfloor) \% P]\} \% M$, in which $P=M/L$; $2 \leq q \leq Q/L$, and q is an integer; and Q equals to N or K.

Expansion Method 6: Small Matrix Outer Expansion and Row Expansion

Row positions of the remaining L−1 non-zero elements in the H matrix are $\lfloor i_0/L \rfloor \times L+(i_0 \% L+1) \% L$, $\lfloor i_0/L \rfloor \times L+(i_0 \% L+2) \% L, \ldots, \lfloor i_0/L \rfloor \times L+(i_0 \% L+L-1) \% L$, and correspondingly, column positions are $(j_0+p) \% Q$, $(j_0+2\times p) \% Q, \ldots, (j_0+(L-1)\times p) \% Q$, in which Q equals to K or N (dependent on the number of columns in the fixed pattern sub matrix), and correspondingly, $1 \leq p \leq Q/L$, and p is an integer.

Expansion Method 7: Small Matrix Outer Expansion and Row Expansion

Row positions of the remaining L−1 non-zero elements in the H matrix are $\lfloor i_0/L \rfloor \times L+(i_0 \% L+1) \% L$, $\lfloor i_0/L \rfloor \times L+(i_0 \% L+2) \% L, \ldots, \lfloor i_0/L \rfloor \times L+(i_0 \% L++L-1) \% L$, and correspondingly, column positions are $(j_0-p) \% Q$, $(j_0-2\times p) \% Q, \ldots, (j_0-(L-1)\times p) \% Q$, in which Q equals to K or N (dependent on the number of columns in the fixed pattern sub matrix), and correspondingly, $1 \leq p \leq Q/L$, and p is an integer.

Expansion Method 8: Small Matrix Outer Expansion and Row Expansion

Row positions of the remaining L−1 non-zero elements in the H matrix are $\lfloor i_0/L \rfloor \times L+(i_0 \% L+1) \% L$, $\lfloor i_0/L \rfloor \times L+(i_0 \% L+2) \% L, \ldots, \lfloor i_0/L \rfloor \times L+(i_0 \% L+L-1) \% L$, and correspondingly, column positions are $\{j_0 \% L+\lfloor 1/P \rfloor \times P+L\times [(1+\lfloor j_0/L \rfloor) \% P]\} \% Q$, $\{j_0 \% L+\lfloor 2/P \rfloor \times P+L\times [(2+\lfloor j_0/L \rfloor) \% P]\} \% Q, \ldots, \{j_0 \% L+\lfloor (L-1)/P \rfloor \times P+L\times [(L-1+\lfloor j_0/L \rfloor) \% P]\} \% Q$, in which Q equals to K or N (dependent on the number of columns in the fixed pattern sub matrix), and correspondingly, $P=Q/L$.

In the ninth step, the attribute of the LDPC code includes at least one of performance of error correcting codes, minimum girth, minimum distance of the codes and error floor.

It is noted that the codewords can be punched out so that some codeword bits are punched out to be adapted to the code rate and code length of the low density Parity Check code. A method of punching is in that: a fixed bit sequence is firstly added into the bit sequence to be encoded, and after being encoded into the codewords, the fixed bit sequence in the codewords is then punched out. The fixed bit sequence is an all-zero bit sequence or a fixed bit sequence of another manner.

The low density Parity Check matrix of the low density Parity Check code is characterized in being a parameter completely representative low density parity matrix. Parameters able to completely represent the low density parity matrix Parity Check matrix are stored in order to regenerate the low density Parity Check matrix in real-time.

For the low density Parity Check matrix of the low density Parity Check code, parameters completely representing the low density Parity Check matrix are in various representative forms. The parity matrices represented by the parameters in the various representative forms are substantially one and the same Parity Check matrix, and after column and row exchanges, the parity matrices may be represented in the same form. The parameters able to completely represent the low density parity matrix are stored in order to regenerate the low density parity matrix in real-time.

The parameters are composed of numeric numbers and mathematical formulae. The mathematical formulae able to partially represent the low density Parity Check matrix are implicitly stored in order to regenerate the low density Parity Check matrix in real-time. Implicitly storing the mathematical formulae is to store the mathematical formulae by using a mathematical logic circuit instead of using the storage spaces. It is a well-known technical in the art to represent the mathematical formulae by using a logic circuit.

Since the low density Parity Check code is a linear block code, data to be encoded which are inputted into a low density Parity Check code encoder (102) are in a block form.

It is noted that the LDPC code encoder (102) may be embodied by the Parity Check matrix H of the low density Parity Check code, or may be embodied by a generation matrix G of the low density Parity Check code. The particular embodiment is dependent on the complexity. The generation matrix G of the low density Parity Check code is obtained dependent on the Parity Check matrix. G and H satisfy the following relation:

$$HG^T = 0 \qquad (2)$$

wherein the superscript T represents the matrix transpose, and the symbol 0 represents an all-zero column vector. The matrix G can be represented as $$G = [I \backslash P] \qquad (3).$$

wherein I represents a unit matrix, and P represents a sub matrix which is dependent on the Parity Check matrix H.

The procedure of obtaining the generation matrix from the Parity Check matrix is completed off-line, instead of being completed by the encoder (102) in real-time during the encoding. Additionally, the generation matrix is characterized in being parameter completely representative. Parameters completely representing the generation matrix are stored in order to facilitate the embodiment of the encoder (102). The generation matrix is characterized in being completely represented by parameters in various representative forms. The generation matrices represented by the parameters in various representative forms are substantially one and the same generation matrix, and after column and row exchanges, the generation matrices are represented in the same form. The parameters completely representing the generation matrix are stored in order to facilitate the embodiment of the encoder (102). The parameters are composed of numeric numbers and mathematical formulae. The mathematical formulae may partially represent the generation matrix, and the mathematical formulae partially representing the generation matrix are implicitly stored in order to facilitate the embodiment of the encoder (102). Implicitly storing the mathematical formulae is to store the mathematical formulae by using a mathematical logic circuit instead of by using the storage spaces, to facilitate the embodiment of the encoder (102).

The low density Parity Check code is a system code. Both the generation matrix and the Parity Check matrix can be parameter completely representative in various forms, and the encoders (102) corresponding to parameters in different forms have different embodiments and details.

In the generation matrix of the low density Parity Check code, a sub matrix composed of matrix columns corresponding to the bits to be encoded may be represented in a unit matrix form after column and row transforms.

The encoder (102) may be embodied from the Parity Check matrix of the low density Parity Check code, and the encoding method includes steps of:

performing column and row transforms of the Parity Check matrix; dividing the column and row transformed Parity Check matrix into two sub matrices which respectively correspond to an information bit sequence composed of bits inputted into the encoder (102) and a parity bit sequence composed of bits to be solved; multiplying the information bit sequence and the sub matrix corresponding to the information bit sequence to obtain an intermediate result; decomposing the sub matrix corresponding to the parity bit sequence to obtain an upper triangle matrix and a lower triangle matrix; solving and obtaining the parity bit sequence by performing an iterative process with the intermediate result, the upper triangle matrix and the lower triangle matrix; connecting the information bit sequence and the parity bit sequence end to end to obtain a combined bit sequence; adjusting a position of each bit in the combined bit sequence to obtain a codeword bit sequence of the low density Parity Check code; and outputting the codewords of the low density Parity Check code.

In which, the column or row transform of the Parity Check matrix may not be performed.

The intermediate result may be also obtained by multiplying the Parity Check matrix and a pre-codeword bit sequence; in which the Parity Check matrix is generated in real-time by using the parameters completely representing the Parity Check matrix; except the different values in the parity bits, the pre-codeword bit sequence and the codeword bit sequence output by the encoder (102) are the same, the parity bits in the pre-codeword bit sequence all have a value of 0.

The intermediate result is stored for the iterative process.

The upper triangle matrix and the lower triangle matrix are both parameter completely representative, and the parameters completely representing the upper triangle matrix and the lower triangle matrix are respectively stored in order to generate the upper triangle matrix and the lower triangle matrix in real-time. In which, parameters completely representing the upper triangle matrix and the lower triangle matrix are in various representative forms, and the parameters able to completely represent the upper triangle matrix and the lower triangle matrix are respectively stored in order to regenerate the upper triangle matrix and the lower triangle matrix in real-time. Additionally, the upper triangle matrix and/or the lower triangle matrix may be represented in a unit matrix form. The parameters completely representing the upper triangle matrix and the lower triangle matrix are composed of numeric numbers and/or mathematical formulae, and the mathematical formulae are stored in a mathematical logic circuit form in order to generate the upper triangle matrix and the lower triangle matrix in real-time.

It is noted that one matrix can be expressed by parameters in various form, which is well-known. For example, in order to store a matrix, either all the elements thereof can be stored, or only the positions of the non-zero elements (or "1" elements) can be stored. As another example, in order to store a matrix, either the positions of the non-zero elements can be stored, or the positions of respective small matrices and the mathematical formulae representing the distribution of the non-zero elements in the small matrices can be stored.

There are a lot of methods for decomposing one square matrix into an upper triangle matrix and a lower triangle matrix (LU decomposition), which can be implemented by those skilled in the art.

Decoding Method:

a metric value corresponding to each codeword bit is calculated according to the constellation mapping scheme; the metric values are blocked; a low density Parity Check matrix of a low density Parity Check code which is also used by a transmitter (100) is regenerated in real-time; a decoding operation of the low density Parity Check code is performed in an iterated manner by using the blocked metric values and the regenerated Parity Check matrix to obtain hard-decision data corresponding to data from an information source (101) of the transmitter (100); and the hard-decision data are outputted.

The Parity Check matrix of the LDPC code is represented as $H=[H_{m,n}]$. A set $N(m)=\{n:H_{m,n}=1\}$ represents all the bit nodes adjacent to the parity node m. A set $M(n)=\{m:H_{m,n}=1\}$ represents all the parity nodes adjacent to the bit node n. A set $N(m)\backslash n$ denotes the set $N(m)$ without the bit node n. A set $M(n)\backslash m$ denotes the set $M(n)$ without the parity node m. The message delivery decoding algorithm comprises steps of:

initialization: setting $z_{m,n}=F_n$, in which $z_{m,n}$ denotes a message delivered from the bit node n to the parity node m, and $F_n$ denotes a Log-Likelihood Ratio (LLR) of receiving the bit n;

iterative process: in each round of iteration, performing the following three steps of:

(1) Message Updating at the Parity Nodes $$T_{m,n} = \prod_{n' \in N(m)\backslash n} \frac{1 - \exp(z_{m,n'})}{1 + \exp(z_{m,n'})} \quad (4)$$

$$L_{m,n} = \ln \frac{1 - T_{m,n}}{1 + T_{m,n}} \quad (5)$$

in which $L_{m,n}$ denotes a message delivered from the parity node m to the bit node n;

(2) Message Updating at the Bit Nodes $$z_{m,n} = F_n + \sum_{m' \in M(n)\backslash m} L_{m',n} \quad (6)$$

$$z_n = F_n + \sum_{m \in M(n)} L_{m,n}. \quad (7)$$

in which $z_n$ denotes a posteriori LLR of the bit n;

(3) Hard-Decision and Termination Rules (a) obtaining a decision codeword $\hat{c}=[\hat{c}_n]$, if $z_n>0$, then $\hat{c}_n=1$, and otherwise, $\hat{c}_n=0$;

(b) if $H\hat{c}=0$, then regarding $\hat{c}$ as a valid decoded codeword, and ending the decoding procedure; if the iteration number of times excesses a predetermined maximum number and $\hat{c}$ is still an invalid codeword, then announcing the decoding failure and ending the decoding procedure; and otherwise, going to the step (1) to continue the iterated decoding procedure.

Next, the decoding algorithm having the reduced complexity will be described. The most obvious complexity reduced decoding algorithm is the one in which the above step (1) is simplified, i.e., the formulae (4) and (5) are simplified into the formula (8) as follows:

$$L_{m,n} = \alpha \times \prod_{n' \in N(m) \backslash n} sgn(z_{m,n'}) \times \min_{n' \in N(m) \backslash n} |z_{m,n'}| \qquad (8)$$

in which $\alpha$ denotes a ratio factor, $sgn(\cdot)$ denotes a operator for getting a sign of a number, and $\min(\cdot)$ denotes a operator for getting a minimum value. In the above decoding algorithm, all relevant $z_{m,n}$ values are read from the storage spaces when executing the formula (8), and all relevant $F_n$ values and $L_{m,n}$ values are read from the storage spaces when executing the formula (6).

Furthermore, an algorithm for reducing the decoder complexity consists in reducing the number of accessing the storage spaces by the decoder processing unit and reducing the number and sizes of the storage spaces. The formulae (6), (7) and (8) are rewritten as:

$$z_{m,n} = V_n - L_{m,n} \qquad (9)$$

$$L_{m,n} = \alpha \times \prod_{n' \in N(m) \backslash n} sgn(z_{m,n'}) \times \min_{n' \in N(m) \backslash n} |z_{m,n'}| \qquad (10)$$

$$U_n = \sum_{m \in M(n)} L_{m,n} \qquad (11)$$

$$V_n = F_n + U_n \qquad (12)$$

The decoder having the reduced complexity contains a $V_n$ storage space, a $L_{m,n}$ storage space, and a (m,n) address storage space. These storage spaces are arranged in a whole block instead of being separated so as to reduce the number of the storage spaces. Storage in a whole block effectively reduces the size of the occupied whole storage space.

In the above order, when executing the formula (9), the values of $V_n$ are read from the V, storage space, the values of $L_{m,n}$ are read from the $L_{m,n}$ storage space (in the initialization phase, $L_{m,n}=0$), the values of $z_{m,n}$ are calculated and obtained but not stored, which are then directly used in executing the formula (10); in which, the address parameters are read from the (m,n) address storage space, the value of the column n corresponding to the row m is calculated, where the m is sequentially stored in an order of 0, 1, 2, . . . . Meanwhile, the hard-decision is made for the $V_n$ to obtain a hard-decision bit which is not stored either but directly used to perform a verification whether the restriction relations are satisfied or not in executing the formula (10), i.e., the step (3) in the above decoding algorithm. For the order of $z_{m,n}$, the row order of the Parity Check matrix is firstly followed, and the column order of the Parity Check matrix is then followed.

Next, the formulae (10), (11) and (12) are executed, the values of $L_{m,n}$ are stored, the values of $U_n$ are not stored, and the values of $V_n$ are stored.

The formula (10) may be replaced with formulae being of other forms and having the same functions (such as formulae (4) and (5)), only if the values of $L_{m,n}$ can be obtained.

For the address sequence of the decoding algorithm represented by the above formulae (9)-(12), the row order of the Parity Check matrix is firstly followed, and the column order of the Parity Check matrix is then followed. That is to say, it only has "the parity node executing order" but doesn't have "the variable node executing order" (firstly following the matrix columns and then following the matrix rows) according to the conventional algorithm.

Once the restriction relations are all satisfied or the maximum iteration number of times is reached, the hard-decision bits 0 or 1 are read from the $V_n$ storage space according to the sequence of the variable nodes, a sequence of these bits is output in any form, which are at least the decision bits of the information bit sequence. Whereas the parity bit sequence is selectable to be output for a Turbo demodulator.

As compared with the conventional decoding algorithm having the reduced complexity, the above complexity reduced decoding algorithm has the following two key advantages:

the first one of reducing the number and size of storage spaces; and the second one of decreasing the number of times for accessing the storage spaces; since it only follows the parity node executing order and many intermediate variables are not stored, obviously, the number of times for accessing the storage spaces is dramatically decreased.

Furthermore, it is obvious that in order to save the storage spaces of the decoder, the number of columns of the Parity Check matrix is preferably set into a power of 2 or slightly less than a power of 2.

In the transmitter (201), the following operations are sequentially performed: firstly inputting data sent from an information source (101) into an LDPC code encoder (102) for encoding; delivering the data into a randomizer (103) for randomizing; delivering the data into an interleaver (104) for interleaving; and delivering the data through a modulator (105) to transmit the data in air. Since the LDPC code is a linear block code, it is necessary to firstly block the data sent from the information source (101) according to the code rate and code length of the LDPC code and the punching conditions, and then to input the data into the LDPC code encoder (102) for encoding. The modulation scheme of the modulator (105) may be a single carrier technique or a multiple carriers technique such as Orthogonal Frequency Division Multiplexing (OFDM) technique.

In the receiver (203), the following operations are sequentially performed: receiving a radio-frequency signal in the air, performing down-conversion and filtering, and obtaining a baseband signal; delivering the baseband signal into a synchronizer (301) to obtain a start position of the synchronization; intercepting data based on the start position of the synchronization, and performing operations including channel estimation and demodulation which are finished in a demodulator (302); delivering the output data into a de-interleaver (303) to perform a de-interleaving operation; delivering the output data into a de-randomizer (304) to perform a de-randomizing operation; delivering the output data into a low density Parity Check code decoder (305) for decoding; and delivering the decoded data to a signal sink (306). The demodulator (302) is responsible for multiple tasks including channel estimation, demodulation and de-mapping. The particular de-mapping method, especially the simplified method thereof, is dependent on the particular mapping scheme and the constellation. By using the de-mapping function, the metric value corresponding to the codeword bits required by the incoming data of the LDPC code decoder (305) can be obtained. The metric value may be of a priori possibility or of a Log-Likelihood Ratio (LLR). Similarly, the bit metric values entering into the decoder (305) are also inputted in blocks and then the decoding operation for the LDPC code is initiated. Comparing the data at the information source (101) and the information sink (306), the bit error rate of the transmission system can be obtained.

The following descriptions are used to illustrate how to effectively construct a Low Density Parity Check code (LDPC) and a system using the LDPC code. In the following descriptions, for the descriptive purpose only, a lot of specific details are exemplified to make the present invention much clearer. However, as obvious for those skilled in the art, some specific details are not necessary when implementing the invention or there are some equivalences. In the respective. embodiments, several well-known structures and apparatuses are shown as the schematic diagrams to avoid their unnecessary blurring the present invention.

Figure 4:
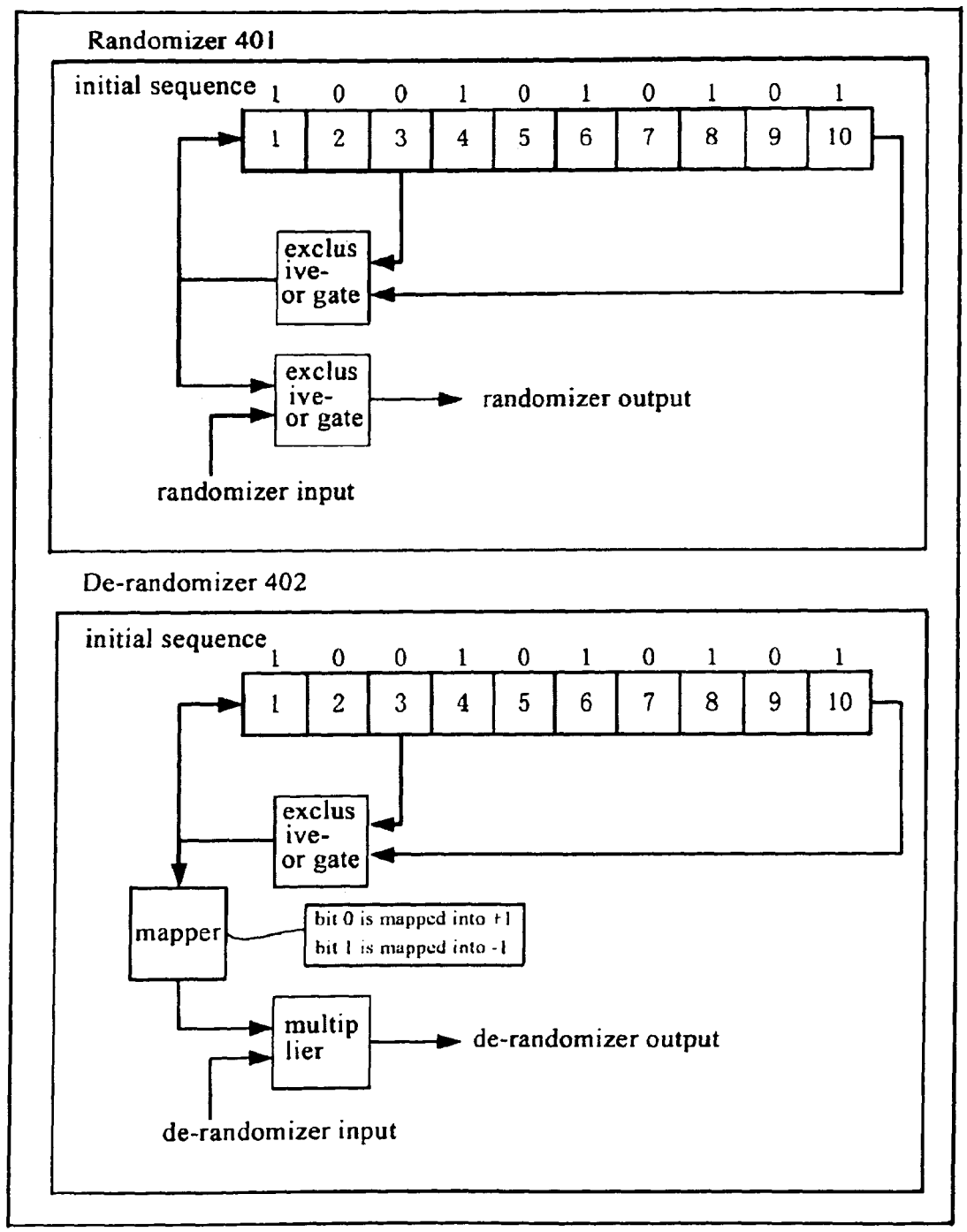
FIG. 4 is an exemplary randomizer (401) and an exemplary de-randomizer (402) in the communication system shown in FIG. 2.
Figure 5:
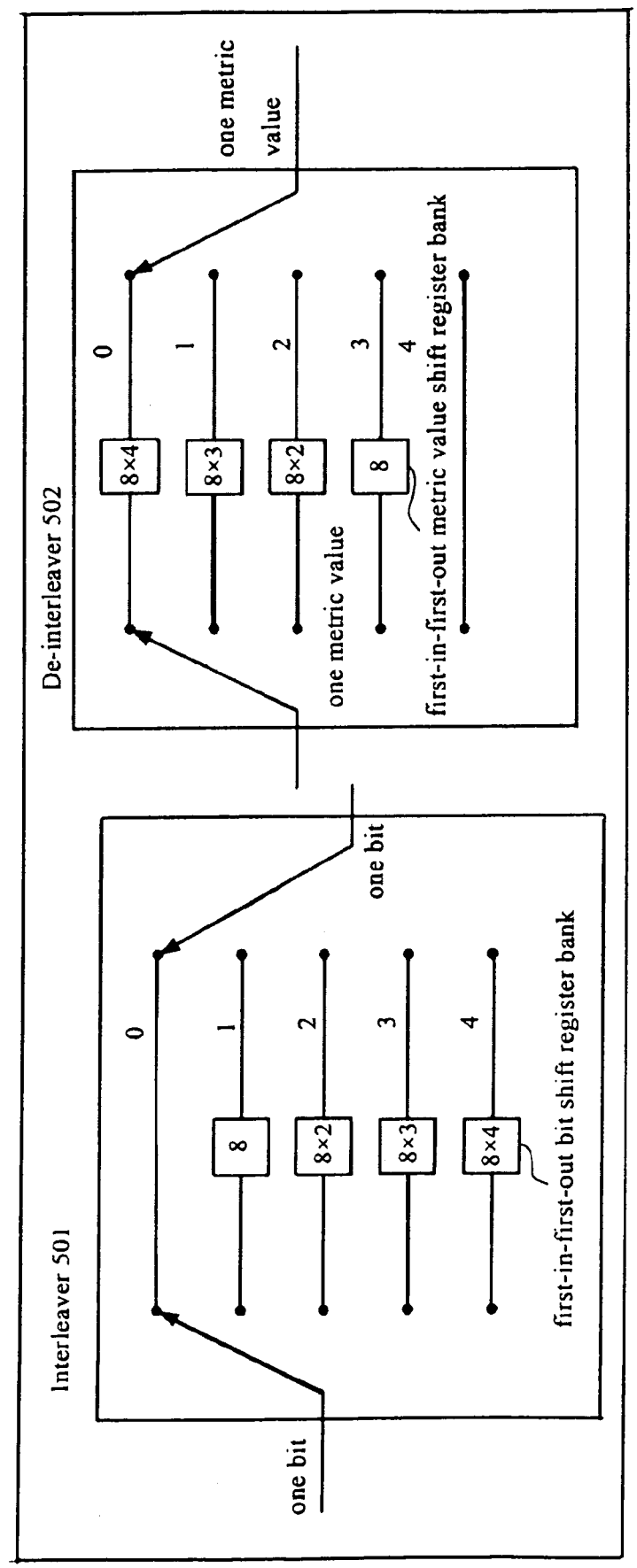
FIG. 5 is an exemplary interleaver (501) and an exemplary de-interleaver (502) in the communication system shown in FIG. 2.

FIG. 1 shows a block diagram of the transmitter in the system of the present invention. Following the encoder of the LDPC code, randomizing, interleaving and modulating are sequentially performed. As per the randomizing, many schemes can be adopted; and FIG. 4 shows one possible exemplary scheme. For the interleaver, there are also many schemes such as the convolution interleaver: and FIG. 5 shows one example of the convolution interleaver. The modulation scheme may be a single carrier one or a multiple carriers one such as the Orthogonal Frequency Division Multiplexing (OFDM) modulation. The inventive points of the present invention consist in that the randomizer is placed after the LDPC code encoder. This is because the output bit sequence from the LDPC code encoder may contain a long string of 0 or 1. It is the most effective method to perform the randomizing after the encoder, which may improve the system performance, for example, may decrease the peak-to-average power ratio in the OFDM system. The order of the encoder and the randomizer may be independent of the LDPC code, and this order can be used for other channel encoding schemes.

Figure 2:
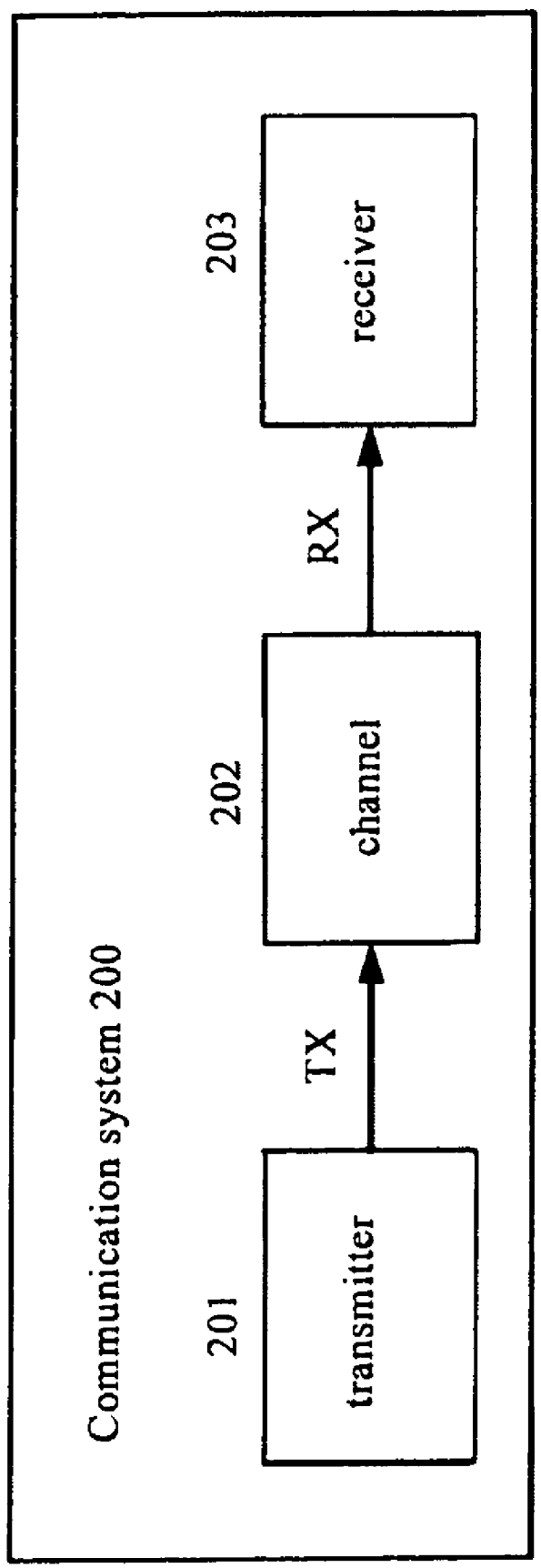
FIG. 2 is a communication system (200) according to an embodiment of the present invention, which includes a transmitter (201), a channel (202) and a receiver (203) and uses the LDPC code.

FIG. 2 is a schematic diagram showing the communication transmission system which includes a transmitter, a receiver and a channel.

Figure 3:
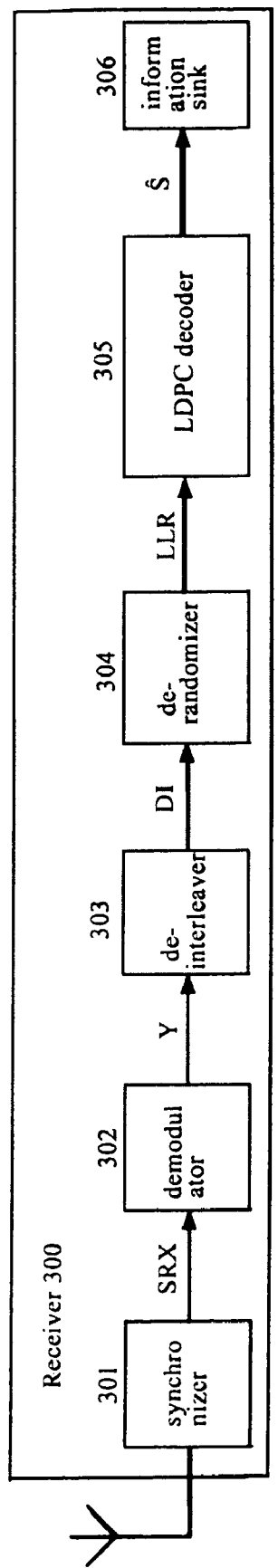
FIG. 3 is an exemplary receiver (300) in the communication system shown in FIG. 2.

FIG. 3 is a block diagram showing the receiver in the system of the present invention. After the radio-frequency signal is down converted, the synchronizer is used to obtain the position of the start data for the synchronization, and this position is in turn used to perform the operations including demodulation, channel estimation, de-mapping and the like, next the de-interleaving and de-randomizing are performed, and finally, the decoding operation for the LDPC code is performed to obtain the decided form of the information bit sequence.

FIG. 4 is a possible exemplary example of the randomizer and the de-randomizer, in which the generation polynomial is $1+x^3+x^{10}$.

FIG. 5 is an example of the bit-based convolution interleaver and de-convolution de-interleaver. There are 5 branches each having a storage space of multiples of 8 bits. Each storage space is a first-in-first-out shift register bank. The interleaver includes the bit-based shift register banks, whereas the de-interleaver includes the metric-value-based first-in-first-out shift register banks. The mentioned metric value is a metric value corresponding to the encoded codeword bit generated after the de-mapping, and may be of various forms such as the log-likelihood ratio, possibility or the like. The mapping scheme adopts the Quadrature Phase-Shift Keying (QPSK), 16 Quadrature Amplitude Modulation (16-QAM) or the like. The mapping schemes are well-known in the art and the detailed descriptions thereof are omitted herein.

Figures 6, 7:
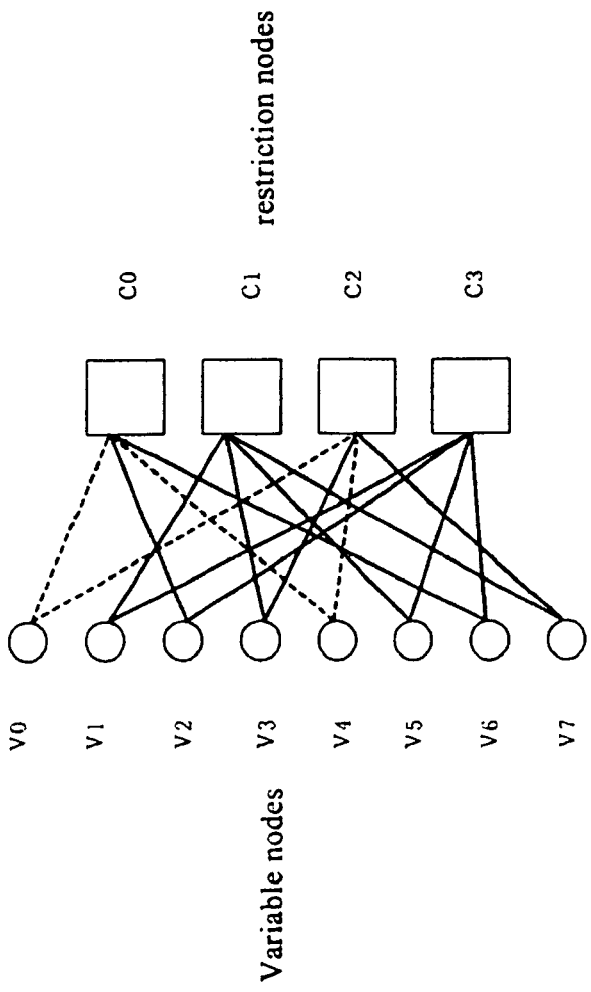
FIG. 6 is an example (600) of a Parity Check matrix of the LDPC code.
FIG. 7 is a Tanner graph (700) of the LDPC code shown in FIG. 6.

FIG. 6 is an example of the Parity Check matrix of the LDPC code. The matrix H has 4 rows and 8 columns. A node corresponding to each row in the Tanner graph (FIG. 7) is called as a restriction node and denoted by $c_i$; and a node corresponding to each column is called as a variable node and denoted by $v_j$. The "1" elements in the matrix H correspond to the connecting lines among these two types of nodes.

FIG. 7 is the Tanner graph corresponding to the Parity Check matrix shown in FIG. 6. The Tanner graph includes two types of nodes, i.e., the variable nodes and the check nodes, and the connecting lines among these two types of nodes correspond to the "1" elements in the Parity Check matrix. In which, the variable nodes are shown as circles, whereas the check nodes are shown as squares. Two variable nodes and two check nodes connected by the dashed line constitute a ring having a length of 4, i.e., containing 4 connecting lines. The concepts of the Tanner graph and the ring are general ones in the LDPC field.

Figure 8:
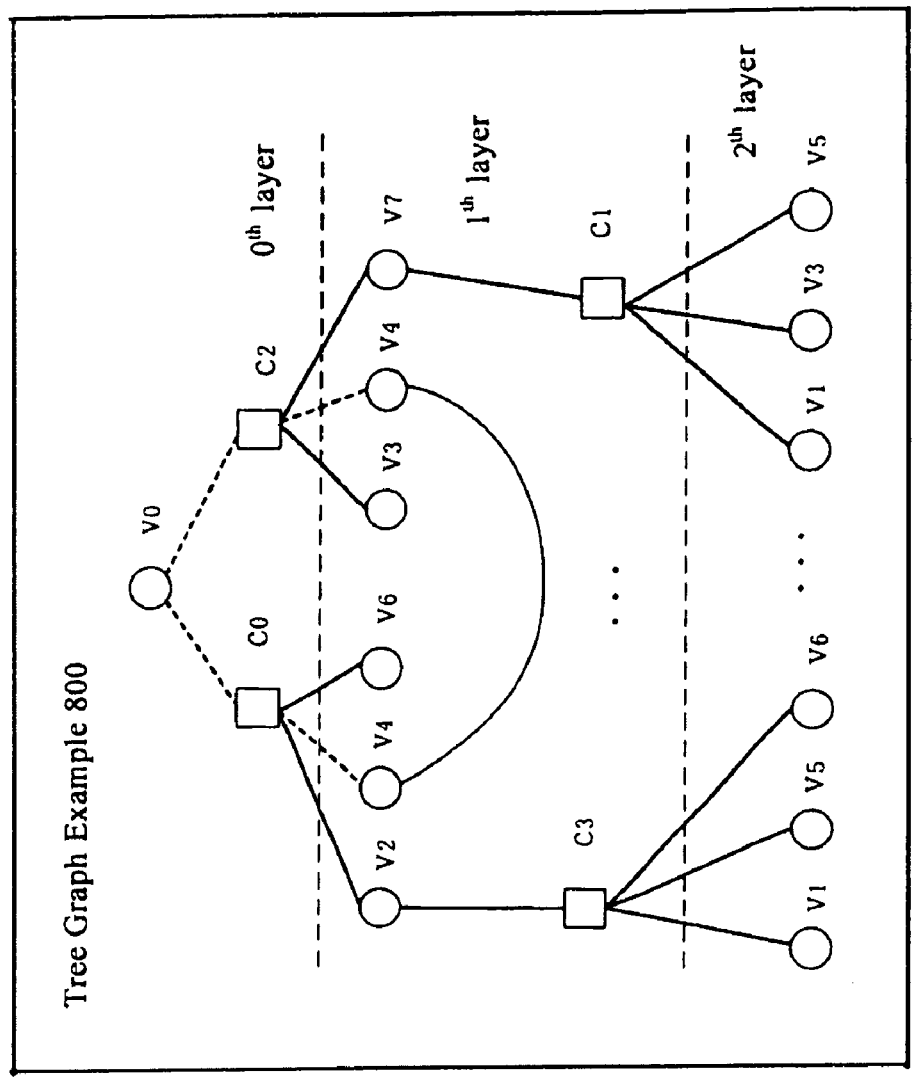
FIG. 8 is a exemplary tree graph (800) of the LDPC code shown in FIG. 6.

FIG. 8 is the tree graph corresponding to FIG. 7. The tree graph is derived from the Tanner graph in which a certain node is regarded as the root and then the nodes and connecting lines are downward exploited there from to obtain the tree graph. In the graph, the dashed line constitutes a ring having a length of 4. The tree graph is especially useful in calculating the minimum girth.

Figure 9:
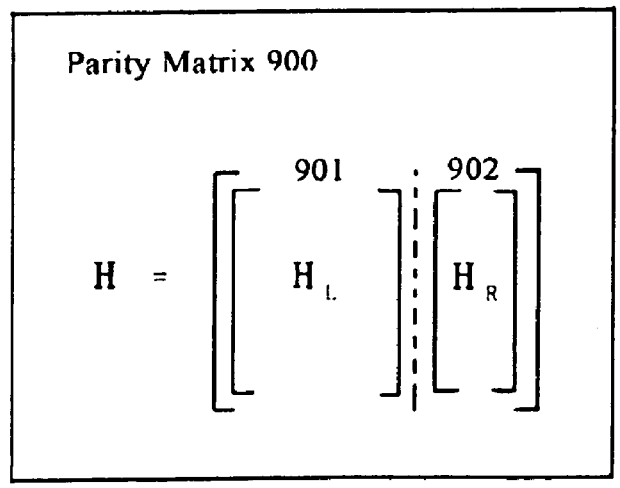
FIG. 9 is an example of a Parity Check matrix of the LDPC code according to the present invention, in which the Parity Check matrix (900) includes two sub matrices.
Figure 10:
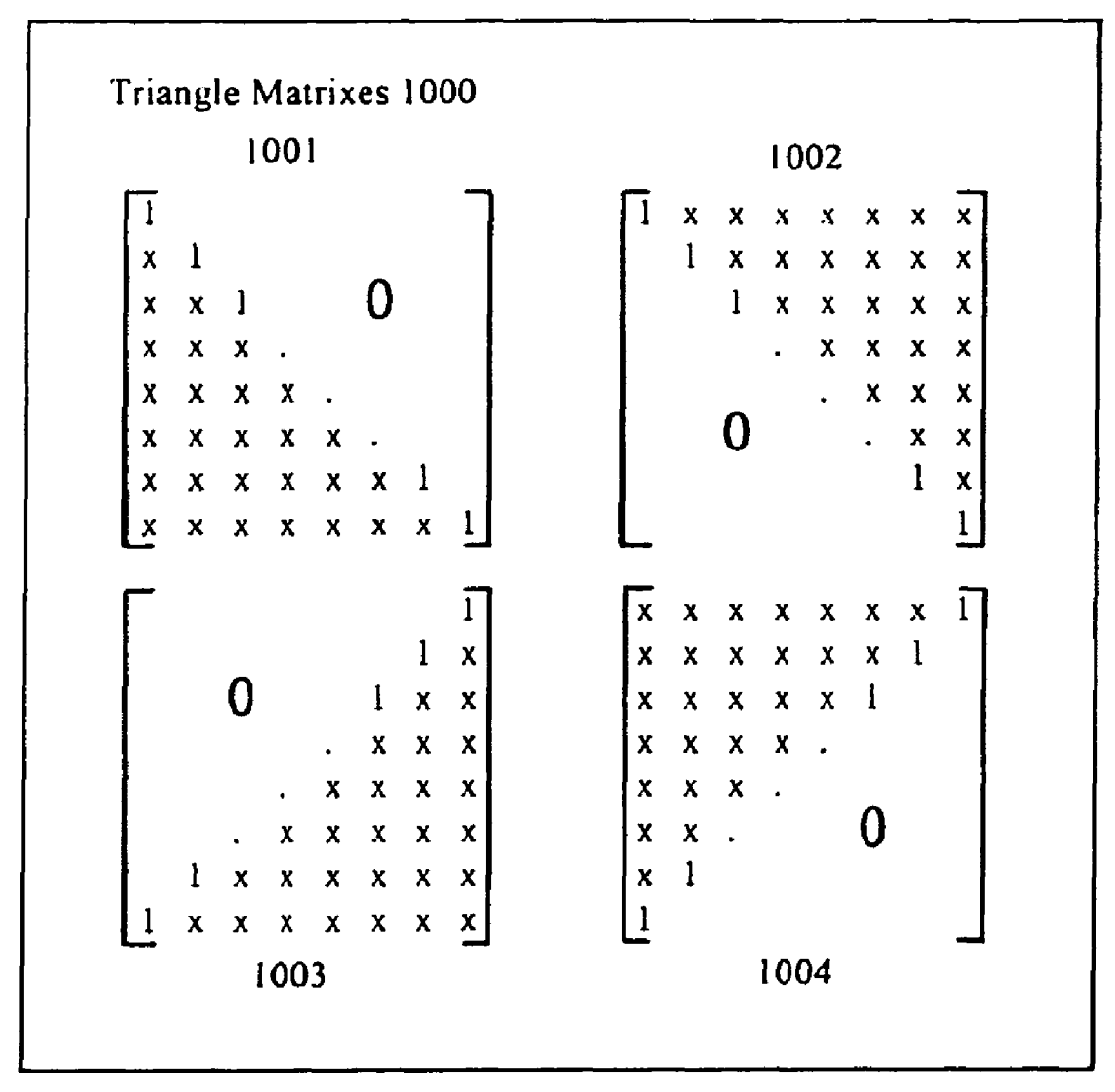

The above-mentioned minimum girth indicates the minimum length among all the rings in the Tanner graph corresponding to the Parity Check matrix H FIG. 9 is the constitute structure of the Parity Check matrix H in the present invention. The Parity Check matrix H includes two sub matrices $H_L$ and $H_R$. At most one of these two sub matrices may be a empty matrix. If neither of these two sub matrices is a empty matrix, then one of them is a square matrix. Further, the particular form of the square matrix may be a triangle matrix such as those special examples shown in FIG. 10. Still further, the triangle matrix may be a further particular form such as those special examples shown in FIG. 11.

Figures 11, 12:
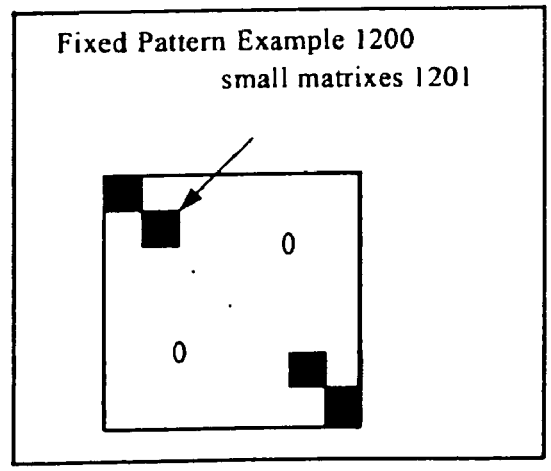
FIG. 11 is an example of some special triangle matrices usable for the Parity Check matrix.
FIG. 12 is examples of fixed patterns (1200) and small matrices (1201)

FIG. 12 is an example of the fixed pattern which may be divided into several small matrix spaces wherein the small matrices shown by the black solid squares indicate that the small matrices contain the non-zero elements. The fixed pattern is characterized in that only the small matrices located on the diagonal contain the non-zero elements, but there is not non-zero element in the remaining space. This is the reason why the fixed pattern is called as "fixed".

Figure 13A:
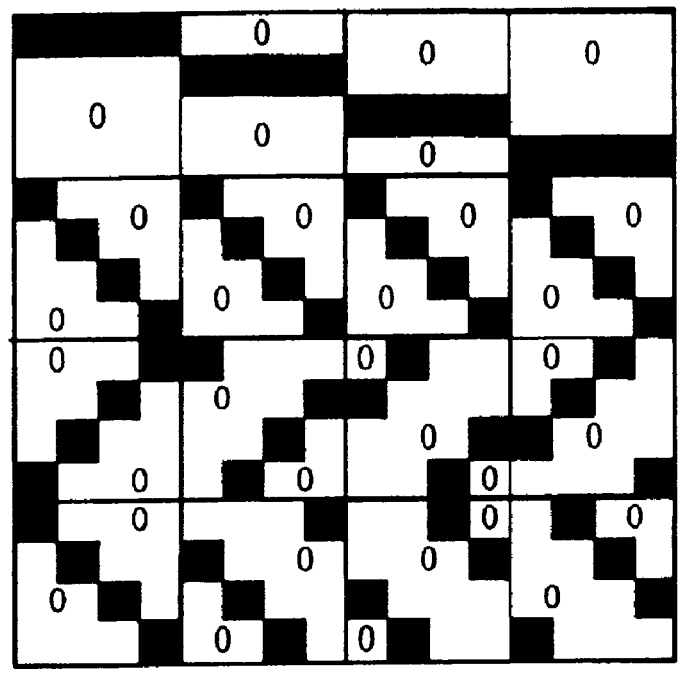
FIG. 13A and FIG. 13B are two examples of the fixed pattern sub matrix.
Figure 13B:
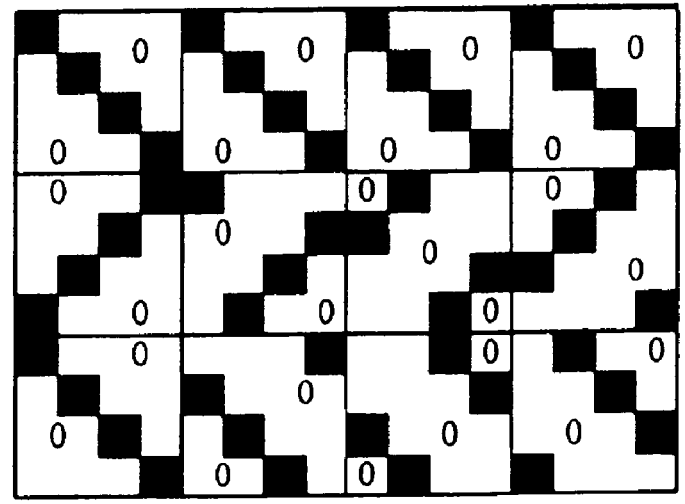
Figure 14A:
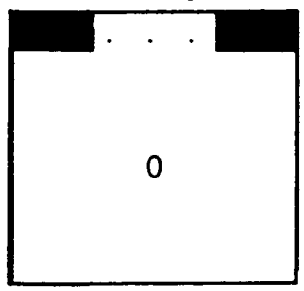
FIG. 14A, FIG. 14B and FIG. 14C show the examples (1401)-(1425) of the fixed pattern set (1400) usable in the present invention, which are all square matrices.
Figure 14A:
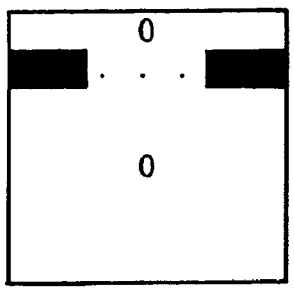
Figure 14A:
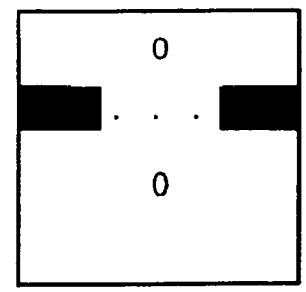
Figure 14A:
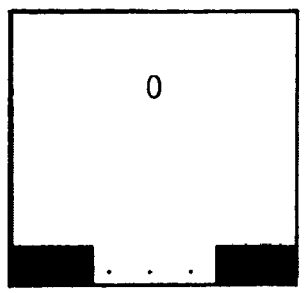
Figure 14A:
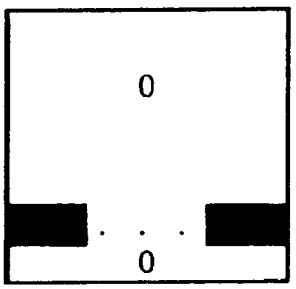
Figure 14A:
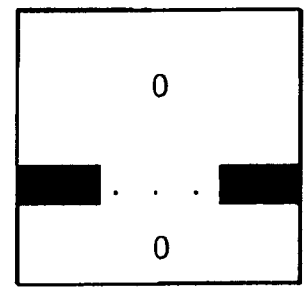
Figure 14A:
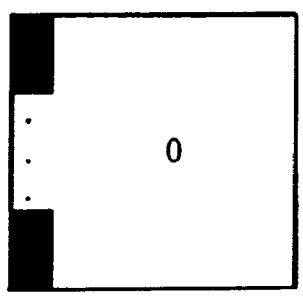
Figure 14A:
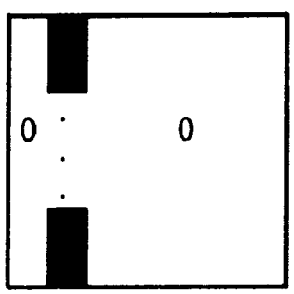
Figure 14A:
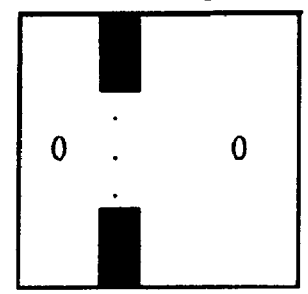
Figure 14A:
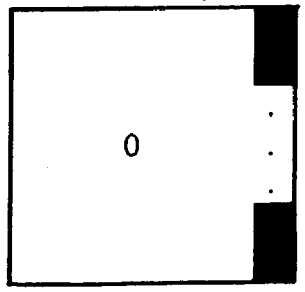
Figure 14A:
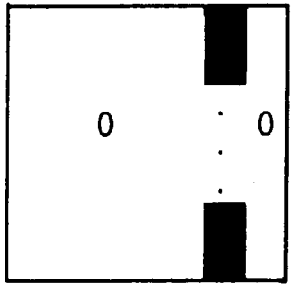
Figure 14A:
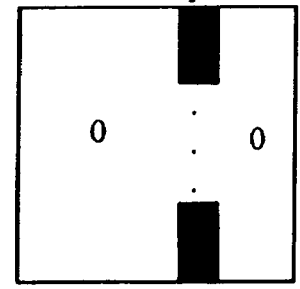
Figure 14B:
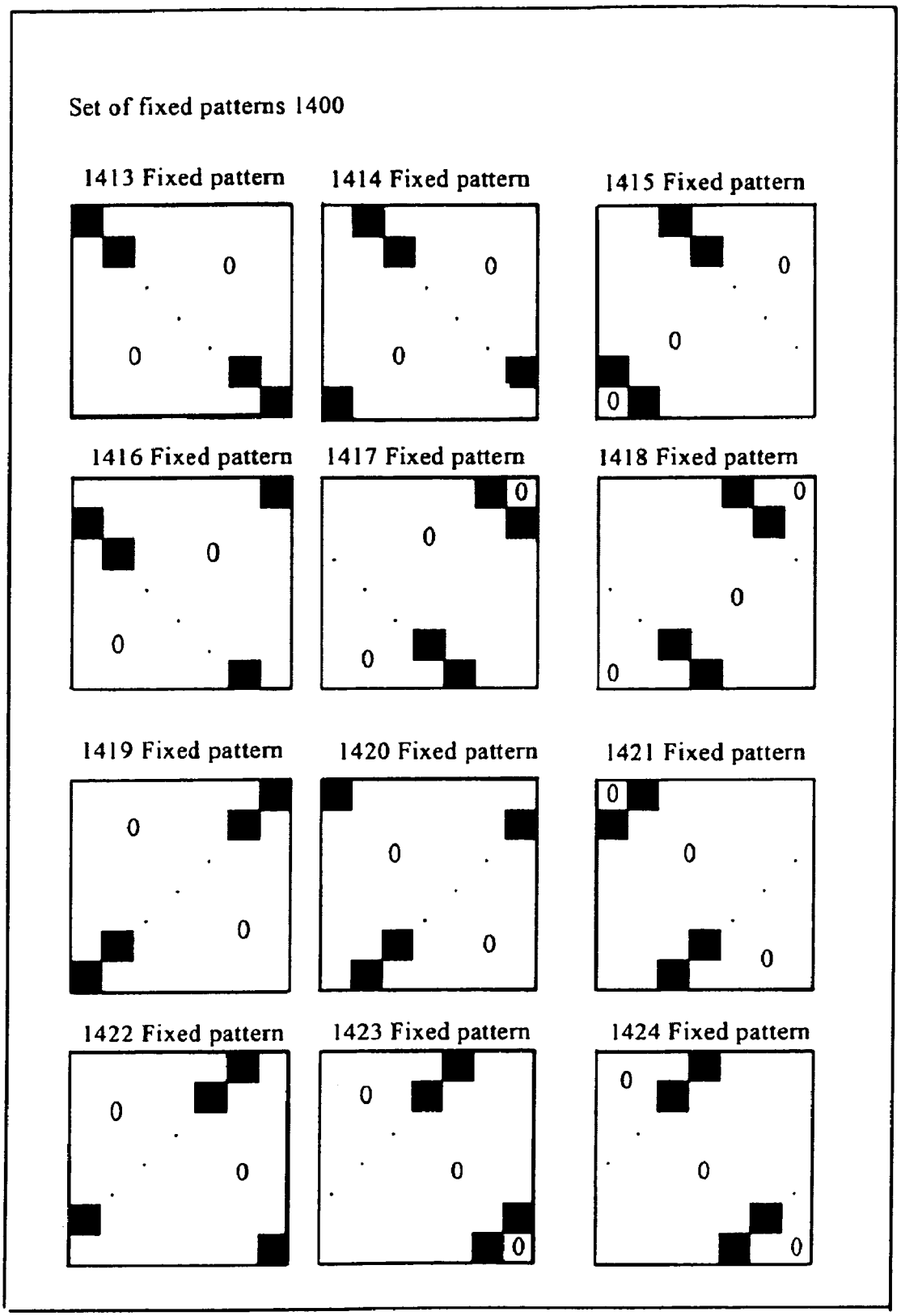
Figure 14C:
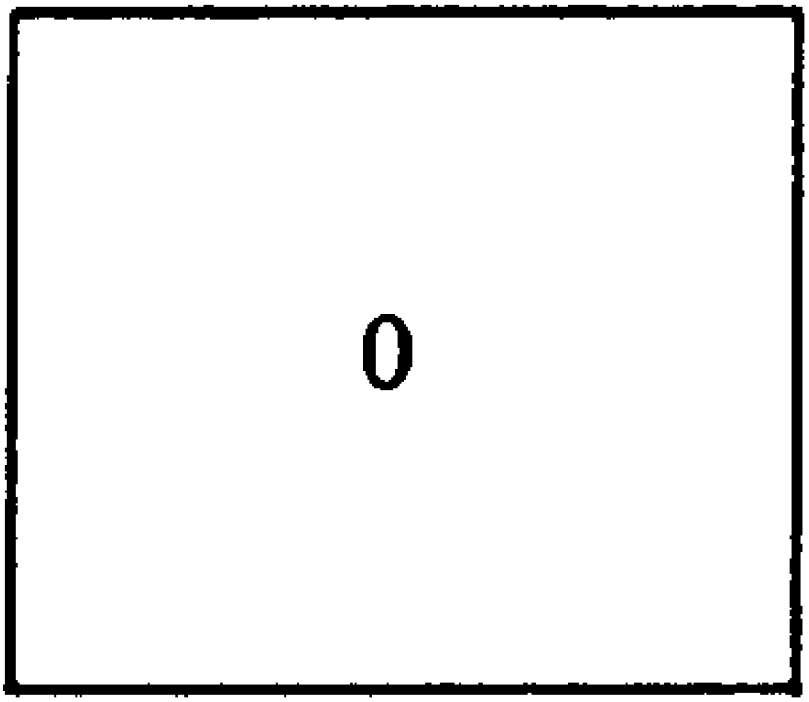
Figure 15:
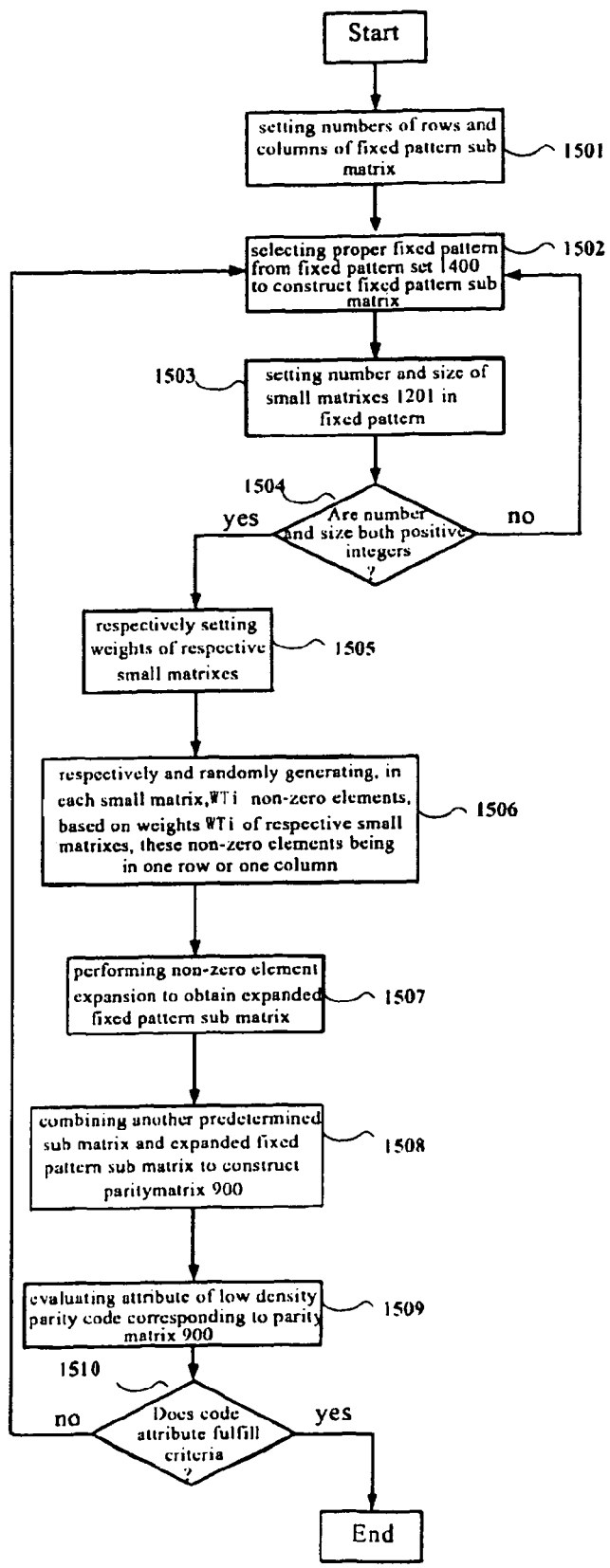
FIG. 15 is a generation procedure of constructing a low density Parity Check code by constructing a fixed pattern sub matrix.
Figure 16:
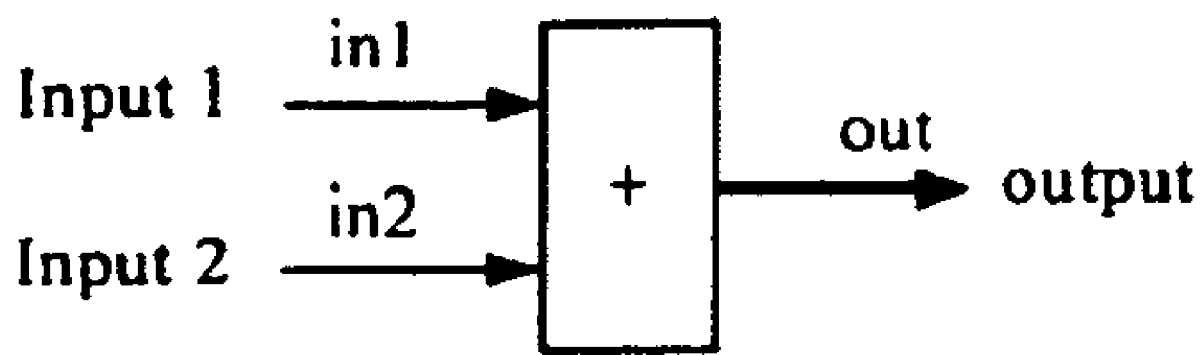
FIG. 16 is an example of representing a mathematical formula by a logic circuit in which the mathematical formula is out=in1+in2.

FIG. 13A and FIG. 13B are two examples of the sub matrices organized from the fixed patterns. The sub matrix 1300A contains 16 fixed patterns each having different arranging rules. The sub matrix 1300B contains 12 fixed patterns.

According to the present invention, a method of constructing a Parity Check matrix of an LDPC code is proposed. Now, one embodiment will be exemplified to describe the invention in details.

We need to design one LDPC code having a code length of N=9216 and a code rate of R=0.5. Thus, the information bit sequence has a length of K=4608, and the parity bit sequence has a length of M=4608. The Parity Check matrix H of this LDPC code has the matrix structure as shown in FIG. 9, i.e., H is composed of the left sub matrix $H_L$ and the right sub matrix $H_R$, both of which are 4608 rows by 4608 columns. Additionally, $H_R$ is set to have the form as (1103), and $H_L$ is set to have the form of (1300A) in which each small matrix has a size of L×L=288×288. The codeword vector of the LDPC code is represented as c=(s,p) in which the codeword bit sequence c=($c_0, c_1$, L, $c_{N-1}$), the information bit sequence s=($s_0, s_1$,L, $s_{K-1}$), and the parity bit sequence p=($p_0, p_1$, L, $p_{M-1}$). The information bit sequence corresponds to the left sub matrix, and the parity bit sequence corresponds to the right sub matrix. The weights of all the small matrices are set to be equal to each other, into 1. It is further provided that there must be one "1" element in the $0^{th}$ column (counted from 0) of each small matrix. Next, a row k in the $0^{th}$ column of each small matrix is randomly generated, i.e., solving the particular position (k,0) of the "1" element in the small matrix, in which $0 \leq k \leq L-1$. Moreover, the position (k,0) in the small matrix can be transformed into the position ($i_0,j_0$) in the Parity Check matrix H, $i_0$=k+L×J and $j_0$=L×K in which (J, K) represents the position of the small matrix in the Parity Check matrix H (both are counted from 0). The following non-zero element expansion method is used:

column positions of the remaining L-1 non-zero elements in the H matrix are $j_0$+1, $j_0$+2, . . . , $j_0$+L-1, and correspondingly, row positions are ($i_0$+p) % M, ($i_0$+2×p) % M, . . . , ($i_0$+(L-1)×p) % M, in which p=16.

The attributes such as error correction performance and the minimum girth of the LDPC code corresponding to the obtained Parity Check matrix are evaluated. The most proper random number k sequence is selected and different small matrices may have different random numbers k. The table below (Table 1) shows the position in the Parity Check matrix for the "1" elements in the $0^{th}$ columns of the respective small matrices corresponding to the left sub matrix (arranged according to the columns of the matrix).

TABLE 1

Matrix Positions for "1" Elements in $0^{th}$ Columns of Respective Small Matrices for Left Sub Matrix

| | | | |
|---|---|---|---|
| 42 | 1218 | 3215 | 3516 |
| 8 | 1576 | 2889 | 4009 |
| 147 | 1815 | 2789 | 4285 |
| 85 | 2039 | 2459 | 4524 |
| 430 | 1290 | 2333 | 3973 |
| 386 | 1640 | 3284 | 4166 |
| 409 | 1888 | 2985 | 4337 |
| 484 | 2099 | 2659 | 3635 |
| 600 | 1297 | 2821 | 4158 |
| 638 | 1659 | 2557 | 4524 |
| 619 | 1882 | 3316 | 3563 |
| 684 | 2147 | 3159 | 4031 |
| 1116 | 1249 | 2896 | 4509 |
| 1083 | 1526 | 2698 | 3600 |
| 1082 | 2015 | 2407 | 3855 |
| 896 | 2023 | 3390 | 4262 |

Table 1 is explained as follows. There are total 16 rows in Table 1, and each row corresponds to one column of the small matrices of the pattern shown as (1300A). Each row in Table 1 has 4 values corresponding to the number (4) of small matrices in each column of (1300A). The numeric numbers in Table 1 indicates the respective row values $i_0$ of the Parity Check matrix corresponding to the "1" elements in the $0^{th}$ columns of the small matrices. For example, the numeric number 42 indicates that the element in the $0^{th}$ column and the $42^{nd}$ row of the most upper-left small matrix of (1300A) is the "1" element.

Figure 17:
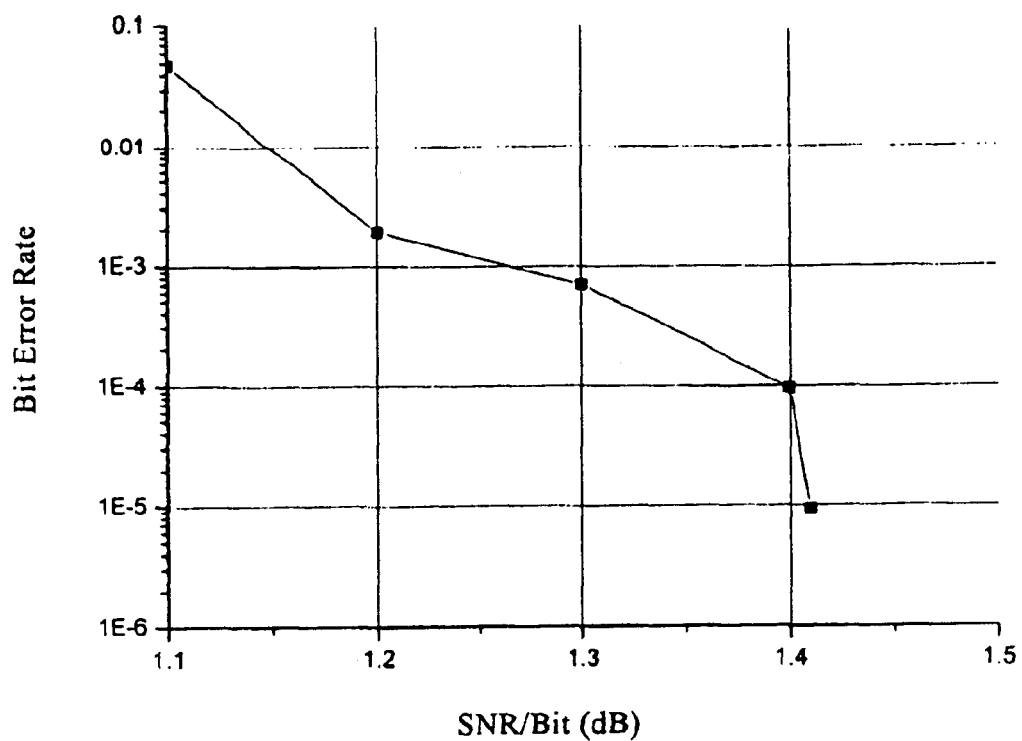
FIG. 17 is a bit error rate curve of a specific LDPC code according to the present invention.
Figure 18:
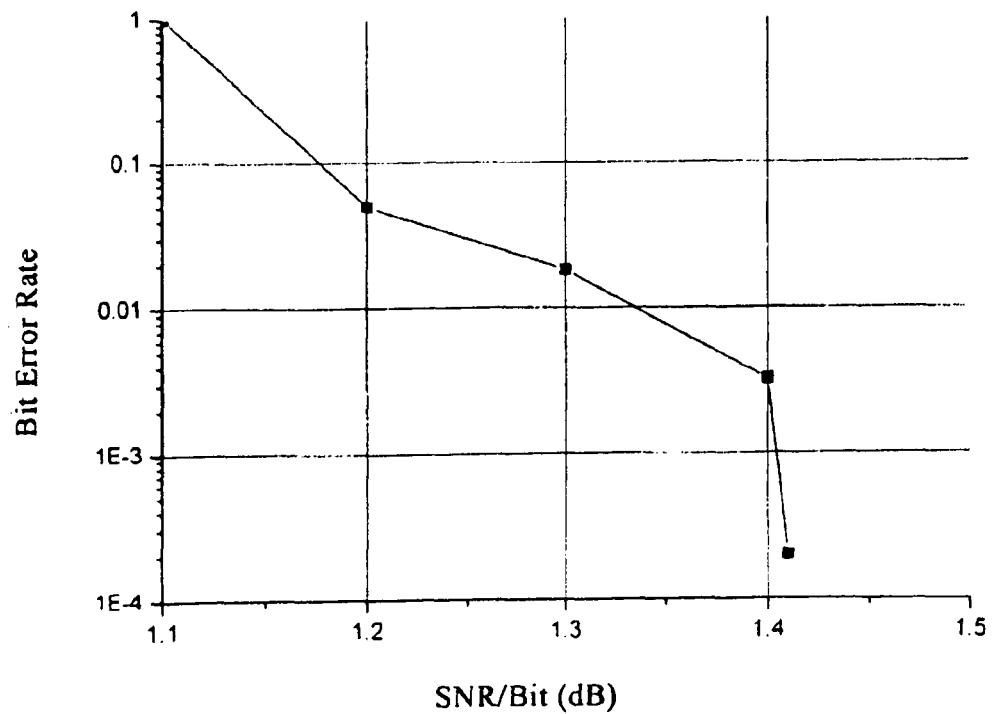
FIG. 18 is a block error rate curve of a specific LDPC code according to the present invention.

The performance of the above LDPC code is simulated to obtain those as shown in FIGS. 17 and 18.

The proposed LDPC code constructing method and the transmission system skillfully combine the two methods of constructing the Parity Check matrix of the LDPC code mentioned in Background. According to the present invention, the proposed constructing method may create a Parity Check matrix of an LDPC code having excellent performances and the encoding/decoding methods for the LDPC code having the reduced complexity.

The present invention proposes a transmission system using the LDPC code and the key inventive point consists in locating the randomizing operation after the channel encoding operation. This is because the codewords of the LDPC code may contain a long string of bits 0 or 1. In order to not influencing the synchronizing operation in the receiver, the randomizing module is added after the LDPC code encoder in the transmitter, which effectively changes the situation where the long string of bits 0 or 1 exists, so that the synchronizing function in the receiver can be smoothly effected. Performing the randomizing operation after the encoder may also improve the other features of some transmission systems. For example, in the multiple carriers systems, it may improve the peak-to-average power ratio and the like. Correspondingly, the receiver firstly performs the de-randomizing operation and then performs the decoding operation for the LDPC code.

Although the present invention is described in conjunction with the examples and embodiments, the present invention is not intended to be limited thereto. On the contrary, the present invention obviously covers the various modifications and may equivalences, which are all enclosed in the scope of the following claims.

What is claimed is:

1. A method of constructing a low density Parity Check code, comprising:
    constructing a low density Parity Check matrix of the low density Parity Check code by using a fixed pattern, the low density Parity Check matrix including a fixed pattern sub matrix constructed by selecting a proper fixed pattern from a fixed pattern set;
    blocking data sent from an information source, encoding the data by directly or indirectly using the constructed low density Parity Check matrix to obtain codewords of the low density Parity Check code; and
    outputting the codewords of the low density Parity Check code.

2. The method according to claim 1, wherein:
    the low density Parity Check matrix is composed of two sub matrices.

3. The method according to claim 2, wherein:
    at most one of the two sub matrices represents an empty matrix.

4. The method according to claim 3, wherein:
    when only one of the two sub matrices is an empty matrix, the low density Parity Check matrix only includes one sub matrix which is called as a fixed pattern sub matrix.

5. The method according to claim 3, wherein:
    when neither of the two sub matrices is an empty matrix, one of the sub matrices represents a square matrix and corresponds to a parity bit sequence.

6. The method according to claim 5, wherein:
    the sub matrix representing the square matrix is one of various triangle matrices.

7. The method according to claim 5, wherein:
    when neither of the two sub matrices is an empty matrix, the other sub matrix is called as a fixed pattern sub matrix and corresponds to an information bit sequence.

8. The method according to claim 4 or 7, wherein:
constructing the fixed pattern sub matrix and thereby constructing the low density Parity Check code comprises:
a first step of setting the numbers of rows and columns of the fixed pattern sub matrix;
a second step of selecting the proper fixed pattern from the fixed pattern set to construct the fixed pattern sub matrix;
a third step of setting the number and size of small matrices in the fixed pattern;
a fourth step of judging whether the number and size of the small matrices are both positive integers; if so, performing a fifth step, and otherwise, going to the second step;
a fifth step of respectively setting weights of respective small matrices;
a sixth step of respectively and randomly generating, in each small matrix, non-zero elements having the number equal to the weight of the current small matrix, based on the weights of respective small matrices, these non-zero elements being in one row or one column;
a seventh step of performing non-zero element expansion to obtain an expanded fixed pattern sub matrix;
an eighth step of combining another predetermined sub matrix and the expanded fixed pattern sub matrix to construct a Parity Check matrix;
a ninth step of evaluating an attribute of a low density Parity Check code corresponding to the Parity Check matrix;
a tenth step of judging whether the attribute of the low density Parity Check code fulfills criteria or not; if so, completing the construction procedure of the low density Parity Check code, and otherwise, going to the second step.

9. The method according to claim 8, wherein:
in the first step, the numbers of rows and columns of the fixed pattern sub matrix are set based on a code rate and a code length of the low density Parity Check code as well as the another sub matrix of the Parity Check matrix.

10. The method according to claim 8, wherein:
in the second step, rules for selecting the proper fixed pattern to construct the fixed pattern sub matrix include requirements on degree distribution of variable nodes and/or check nodes, requirements on a ratio of the number of rows to the number of columns of the fixed pattern sub matrix, and requirements on saving storage spaces of a decoder; in which one method of saving the storage spaces is to set the sizes of the small matrices into powers of 2.

11. The method according to claim 8, wherein:
in the fifth step, the weights of different small matrices may be equal or not; the weights of some small matrices may be 0; a rule for determining the weights of the small matrices is requirements on degree distribution of variable nodes and/or check nodes.

12. The method according to claim 8, wherein:
in the sixth step, it can be simplified into a semi-random manner, i.e., a row or column position is fixed in advance, and then a corresponding column or row position is randomly selected.

13. The method according to claim 8, wherein:
in the seventh step, methods for expanding the non-zero elements include small matrix inner expansion, small matrix outer expansion, column expansion mode, a row expansion mode, a hybrid expansion mode or their combination.

14. The method according to claim 13, wherein:
the specific non-zero expansion method is at least one of a small matrix inner expansion method 1 or a small matrix inner expansion method 2 or a small matrix outer expansion and column expansion method 3 or a small matrix outer expansion and column expansion method 4 or a small matrix outer expansion and column expansion method 5 or a small matrix outer expansion and row expansion method 6 or a small matrix outer expansion and row expansion method 7 or and a small matrix outer expansion and row expansion method 8.

15. The method according to claim 14, wherein:
the small matrix inner expansion method 1 is that:
column positions of the remaining L−1 non-zero elements in the H Matrix are $\lfloor j_0/L \rfloor \times L+(j_0 \% L+1) \% L$, $\lfloor j_0/L \rfloor \times L+(j_0 \% L+2) \% L, \ldots, \lfloor j_0/L \rfloor \times L+(j_0 \% L+L-1) \% L$, and correspondingly, row positions are $\lfloor i_0/L \rfloor \times L+(i_0 \% L+1) \% L$, $\lfloor i_0/L \rfloor \times L+(i_0 \% L+2) \% L, \ldots, \lfloor i_0/L \rfloor \times L+(i_0 \% L+L-1) \% L$, in which the H matrix denotes the Parity Check matrix of the Parity Check code, the symbol % denotes a module operation, the L denotes the numbers of rows and columns of the small matrix, $i_0$ and $j_0$ respectively denote the row position and the column position in the H matrix.

16. The method according to claim 14, wherein:
the small matrix inner expansion method 2 is that:
column positions of the remaining L−1 non-zero elements in the H Matrix are $\lfloor j_0/L \rfloor \times L+(j_0 \% L+1) \% L$, $\lfloor j_0/L \rfloor \times L+(j_0 \% L+2) \% L, \ldots, \lfloor j_0/L \rfloor \times L+(j_0 \% L+L-1) \% L$, and correspondingly, row positions are $\lfloor i_0/L \rfloor \times L+(i_0 \% L-1) \% L$, $\lfloor i_0/L \rfloor \times L+(i_0 \% L-2) \% L, \ldots, \lfloor i_0/L \rfloor \times L+(i_0 \% L-L+1) \% L$, in which the H matrix denotes the Parity Check matrix of the Parity Check code, the symbol % denotes a module operation, the L denotes the numbers of rows and columns of the small matrix, $i_0$ and $j_0$ respectively denote the row position and the column position in the H matrix.

17. The method according to claim 14, wherein:
the small matrix outer expansion and column expansion method 3 is that:
column positions of the remaining L−1 non-zero elements in the H Matrix are $\lfloor j_0/L \rfloor \times L+(j_0 \% L+1) \% L$, $\lfloor j_0/L \rfloor \times L+(j_0 \% L+2) \% L, \ldots, \lfloor j_0/L \rfloor \times L+(j_0 \% L+L-1) \% L$, or the column positions are $(j_0+q) \% Q$, $(j_0+2\times q) \% Q, \ldots, (j_0+(L-1)\times q) \% Q$, and correspondingly, row positions are $(i_0+p) \% M$, $(i_0+2\times p) \% M, \ldots, (i_0+(L-1)\times p) \% M$, in which the H Matrix denotes the Parity Check matrix of the Parity Check code, the symbol % denotes a module operation, the L denotes the numbers of rows and columns of the small matrix, $i_0$ and $j_0$ respectively denote the row position and the column position in the H matrix; $1 \leq p \leq M/L$, and p is an integer; $2 \leq q \leq Q/L$, and q is an integer; Q is the code length or a length of the bit sequence to be encoded, and M is the number of rows in the H matrix.

18. The method according to claim 14, wherein:
the small matrix outer expansion and column expansion method 4 is that:
column positions of the remaining L−1 non-zero elements in the H Matrix are $\lfloor j_0/L \rfloor \times L+(j_0 \% L+1) \% L$, $\lfloor j_0/L \rfloor \times L+(j_0 \% L+2) \% L, \ldots, \lfloor j_0/L \rfloor \times L+(j_0 \% L+L-1) \% L$, or the column positions are $(j_0+q) \% Q$, $(j_0+2\times q) \% Q, \ldots, (j_0+(L-1)\times q) \% Q$, and correspondingly, row positions are $(i_0-p) \% M$, $(i_0-2\times p) \% M, \ldots, (i_0-(L-1)\times p) \% M$, in which the H matrix denotes the Parity Check matrix of the Parity Check code, the symbol % denotes a module operation, the L denotes the numbers of rows and columns of the small matrix, $i_0$ and $j_0$ respectively denote the row position and the column position in the H matrix; $1 \leq p \leq M/L$, and p is an integer; $2 \leq q \leq Q/L$, and q is an integer; Q is the code length or a length of the bit sequence to be encoded, and M is the number of rows in the H matrix.

19. The method according to claim 14, wherein:
the small matrix outer expansion and column expansion method 5 is that:
column positions of the remaining L−1 non-zero elements in the H Matrix are $\lfloor j_0/L \rfloor \times L+(j_0 \% L+1) \% L$, $\lfloor j_0/L \rfloor \times L+(j_0 \% L+2) \% L, \ldots, \lfloor j_0/L \rfloor \times L+(j_0 \% L+L-1) \% L$, or the column positions are $(j_0+q) \% Q$, $(j_0+2 \times q) \% Q, \ldots, (j_0+(L-1) \times q) \% Q$, and correspondingly, row positions are $\{i_0 \% L+\lfloor 1/P \rfloor \times P+L \times [(1+\lfloor i_0/L \rfloor) \% P]\} \% M$, $\{i_0 \% L+\lfloor 2/P \rfloor \times P+L \times [(2+\lfloor i_0/L \rfloor) \% P]\} \% M, \ldots, \{i_0 \% L+\lfloor (L-1)/P \rfloor \times P+L \times [(L-1+\lfloor i_0/L \rfloor) \% P]\} \% M$, in which the H matrix denotes the Parity Check matrix of the Parity Check code, the symbol % denotes a module operation, the L denotes the numbers of rows and columns of the small matrix, $i_0$ and $j_0$ respectively denote the row position and the column position in the H matrix; P=M/L; $2 \leq q \leq Q/L$, and q is an integer: Q is the code length or a length of the bit sequence to be encoded, and M is the number of rows in the H matrix.

20. The method according to claim 14, wherein:
the small matrix outer expansion and row expansion method 6 is that:
row positions of the remaining L−1 non-zero elements in the H matrix are $\lfloor i_0/L \rfloor \times L+(i_0 \% L+1) \% L$, $\lfloor i_0/L \rfloor \times L+(i_0 \% L+2) \% L, \ldots, \lfloor i_0/L \rfloor \times L+(i_0 \% L+L-1) \% L$, and correspondingly, column positions are $(j_0+p) \% Q$, $(j_0+2 \times p) \% Q, \ldots, (j_0+(L-1) \times p) \% Q$, in which the H matrix denotes the Parity Check matrix of the Parity Check code, the symbol % denotes a module operation, the L denotes the numbers of rows and columns of the small matrix, $i_0$ and $j_0$ respectively denote the row position and the column position in the H matrix; Q is the code length or a length of the bit sequence to be encoded (dependent on the number of columns in the fixed pattern sub matrix), and correspondingly, $1 \leq p \leq Q/L$, and p is an integer.

21. The method according to claim 14, wherein:
the small matrix outer expansion and row expansion method 7 is that:
row positions of the remaining L−1 non-zero elements in the H matrix are $\lfloor i_0/L \rfloor \times L+(i_0 \% L+1) \% L$, $\lfloor i_0/L \rfloor \times L+(i_0 \% L+2) \% L, \ldots, \lfloor i_0/L \rfloor \times L+(i_0 \% L+L-1) \% L$, and correspondingly, column positions are $(j_0-p) \% Q$, $(j_0-2 \times p) \% Q, \ldots, (j_0-(L-1) \times p) \% Q$, in which the H matrix denotes the Parity Check matrix of the Parity Check code, the symbol % denotes a module operation, the L denotes the numbers of rows and columns of the small matrix, $i_0$ and $j_0$ respectively denote the row position and the column position in the H matrix; Q is the code length or a length of the bit sequence to be encoded (dependent on the number of columns in the fixed pattern sub matrix), and correspondingly, $1 \leq p \leq Q/L$, and p is an integer.

22. The method according to claim 14, wherein:
the small matrix outer expansion and row expansion method 8 is that:
row positions of the remaining L−1 non-zero elements in the H matrix are $\lfloor i_0/L \rfloor \times L+(i_0 \% L+1) \% L$, $\lfloor i_0/L \rfloor \times L+(i_0 \% L+2) \% L, \ldots, \lfloor i_0/L \rfloor \times L+(i_0 \% L+L-1) \% L$, and correspondingly, column positions are $\{j_0 \% L+\lfloor 1/P \rfloor \times P+L \times [(1+\lfloor j_0/L \rfloor) \% P]\} \% Q$, $\{j_0 \% L+\lfloor 2/P \rfloor \times P+L \times [(2+\lfloor j_0/L \rfloor) \% P]\} \% Q, \ldots, \{j_0 \% L+\lfloor (L-1)/P \rfloor \times P+L \times [(L-1+\lfloor j_0/L \rfloor) \% P]\} \% Q$, in which the H matrix denotes the Parity Check matrix of the Parity Check code, the symbol % denotes a module operation, the L denotes the numbers of rows and columns of the small matrix, $i_0$ and $j_0$ respectively denote the row position and the column position in the H matrix; Q is the code length or a length of the bit sequence to be encoded (dependent on the number of columns in the fixed pattern sub matrix), and correspondingly, P=Q/L.

23. The method according to claim 14, wherein:
in the ninth step, the attribute of the low density Parity Check code includes at least one of error correction performance, minimum girth, minimum distance of the code and error floor.

24. The method according to claim 1, wherein:
the codewords can be punched so that some codeword bits are punched out to be adapted to the code rate and code length of the low density Parity Check code.

25. The method according to claim 24, wherein:
the method of punching is in that: a fixed bit sequence is firstly added into the bit sequence to be encoded, and after being encoded into the codewords, the fixed bit sequence in the codewords is then punched out.

26. The method according to claim 25, wherein:
the fixed bit sequence is an all-zero bit sequence or a fixed bit sequence of another manner.

27. The method according to claim 1, wherein:
the low density Parity Check matrix of the low density Parity Check code is a parameter completely representative low density Parity Check matrix, and parameters able to completely represent the low density Parity Check matrix are stored in order to regenerate the low density Parity Check matrix in real-time.

28. The method according to claim 1, wherein:
for the low density Parity Check matrix of the low density Parity Check code, parameters completely representing the low density Parity Check matrix are in various representative forms; the parity matrices represented by the parameters in the various representative forms are substantially one and the same Parity Check matrix, after column and row exchanges, the parity matrices may be represented in the same form; and the parameters able to completely represent the low density Parity Check matrix are stored in order to regenerate the low density Parity Check matrix in real-time.

29. The method according to claim 27 or 28, wherein:
the parameters are composed of numeric numbers and mathematical formulae.

30. The method according to claim 29, wherein:
the mathematical formulae may partially represent the low density Parity Check matrix, and the mathematical formulae able to partially represent the low density Parity Check matrix are implicitly stored in order to regenerate the low density Parity Check matrix in real-time.

31. The method according to claim 30, wherein:
implicitly storing the mathematical formulae is to store the mathematical formulae by using a mathematical logic circuit.

32. The method according to claim 1, wherein:
the low density Parity Check code is a linear block code, and data to be encoded which are inputted into a low density Parity Check code encoder are in a block form.

33. The method according to claim 32, wherein:
the encoder is embodied by a generation matrix of the low density Parity Check code.

34. The method according to claim 33, wherein:
the generation matrix of the low density Parity Check code is obtained dependent on the Parity Check matrix, and the procedure of obtaining the generation matrix from the Parity Check matrix is completed off-line.

35. The method according to claim 33, wherein:
the generation matrix is parameter completely representative, and parameters completely representing the generation matrix are stored in order to facilitate the embodiment of the encoder.

36. The method according to claim 33, wherein:
the generation matrix is completely represented by parameters in various representative forms; the generation matrices represented by the parameters in various representative forms are substantially one and the same generation matrix, after column and row exchanges, the generation matrices are represented in the same form; and the parameters completely representing the generation matrix are stored in order to facilitate the embodiment of the encoder.

37. The method according to claim 35 or 36, wherein:
the parameters are composed of numeric numbers and mathematical formulae.

38. The method according to claim 37, wherein:
the mathematical formulae partially represent the generation matrix, and the mathematical formulae partially representing the generation matrix are implicitly stored in order to facilitate the embodiment of the encoder.

39. The method according to claim 38, wherein:
implicitly storing the mathematical formulae is to store the mathematical formulae by using a mathematical logic circuit.

40. The method according to claim 33, wherein:
in the generation matrix of the low density Parity Check code, a sub matrix composed of matrix columns corresponding to the bits to be encoded may be represented in a unit matrix form after column and row transforms.

41. The method according to claim 32, wherein:
the encoder is embodied by the Parity Check matrix of the low density Parity Check code.

42. The method according to claim 41, wherein:
a method of embodying the encoder from the Parity Check matrix of the low density Parity Check code includes steps of:
performing column and row transforms of the Parity Check matrix;
dividing the column and row transformed Parity Check matrix into two sub matrices which respectively correspond to an information bit sequence composed of bits inputted into the encoder and a parity bit sequence composed of bits to be solved;
multiplying the information bit sequence and the sub matrix corresponding to the information bit sequence to obtain an intermediate result;
decomposing the sub matrix corresponding to the parity bit sequence to obtain an upper triangle matrix and a lower triangle matrix;
solving and obtaining the parity bit sequence by performing an iterative process with the intermediate result, the upper triangle matrix and the lower triangle matrix;
connecting the information bit sequence and the parity bit sequence end to end to obtain a combined bit sequence;
adjusting a position of each bit in the combined bit sequence to obtain a codeword bit sequence of the low density Parity Check code; and
outputting the codewords of the low density Parity Check code.

43. The method according to claim 42, wherein:
the method of embodying the encoder from the Parity Check matrix of the low density Parity Check code further includes:
not performing the column or row transform of the Parity Check matrix;
obtaining the intermediate result by multiplying the Parity Check matrix and a pre-codeword bit sequence;
in which the Parity Check matrix is generated in real-time by using the parameters completely representing the Parity Check matrix;
except the different values in the parity bits, the pre-codeword bit sequence and the codeword bit sequence output by the encoder are the same, the parity bits in the pre-codeword bit sequence all have a value of 0;
the intermediate result is stored for the iterative process.

44. The method according to claim 42, wherein:
the upper triangle matrix and the lower triangle matrix are both parameter completely representative, and the parameters completely representing the upper triangle matrix and the lower triangle matrix are respectively stored in order to generate the upper triangle matrix and the lower triangle matrix in real-time.

45. The method according to claim 44, wherein:
parameters completely representing the upper triangle matrix and the lower triangle matrix are in various representative forms, and the parameters able to completely represent the upper triangle matrix and the lower triangle matrix are respectively stored in order to regenerate the upper triangle matrix and the lower triangle matrix in real-time.

46. The method according to claim 44 or 45, wherein:
the parameters completely representing the upper triangle matrix and the lower triangle matrix are composed of numeric numbers and/or mathematical formulae, and the mathematical formulae are stored in a mathematical logic circuit form in order to generate the upper triangle matrix and the lower triangle matrix in real-time.

47. The method according to claim 42, wherein:
the upper triangle matrix and/or the lower triangle matrix may be represented in a unit matrix form.

48. The method according to claim 1, wherein:
the low density Parity Check code is a system code, both a generation matrix and the Parity Check matrix are parameter completely representative in various forms, and encoders corresponding to parameters in different forms have different embodiments and details.

49. A method of decoding a Parity Check code, comprising:
calculating a metric value corresponding to each codeword bit according to the constellation mapping scheme;
blocking the metric values;
regenerating, in real-time, a low density Parity Check matrix of a low density Parity Check code which is also used by a transmitter, the low density Parity Check matrix may be a Parity Check matrix generated by using a fixed pattern, the low density Parity Check matrix including a fixed pattern sub matrix constructed by selecting a proper fixed pattern from a fixed pattern set;
performing a decoding operation of the low density Parity Check code in an iterated manner by using the blocked metric values and the regenerated Parity Check matrix to obtain hard-decision data corresponding to data from an information source of the transmitter; and
outputting the hard-decision data.

50. The method according to claim 49, wherein:
the method of decoding the Parity Check code is a decoding method having a reduced complexity, in which the complexity is reduced mainly by reducing the number and size of storage spaces of a decoder and decreasing the number of times for accessing the storage spaces.

51. The method according to claim 50, wherein:
an algorithm of the decoding method having the reduced complexity comprises:
a first step of subtracting $L_{m,n}$ from $V_n$ to obtain a corresponding $z_{m,n}$, in which $V_n$ denotes a posteriori log-likelihood ratio of a bit node n, $L_{m,n}$ denotes a message delivered from a parity node m to the bit node n, and $z_{m,n}$ denotes a message delivered from the bit node n to the parity node m;
a second step of obtaining a new value of $L_{m,n}$ by following $$L_{m,n} = \alpha \times \prod_{n' \in N(m)\backslash n} sgn(z_{m,n'}) \times \min_{n' \in N(m)\backslash n} |z_{m,n'}|$$

with the $z_{m,n}$, in which $\alpha$ denotes a predetermined constant, $sgn(\cdot)$ denotes a function of returning a sign of a number, $\min(\cdot)$ denotes a function of returning a minimum value, the set $N(m)$ denotes all bit nodes adjacent to the parity node m, and the set $N(m)\backslash n$ denotes the set $N(m)$ without the bit node n;
a third step of summing up the values of $L_{m,n}$ according to the bit node n to obtain $U_n$, i.e., $$U_n = \sum_{m \in M(n)} L_{m,n},$$

in which the set $M(n)$ denotes all parity nodes adjacent to the bit node n;
a fourth step of adding the $F_n$ and the $U_n$ to obtain $V_n$ in which $F_n$ denotes a log-likelihood ratio of the bit node n received from the decoder, and in the calculation of the $F_n$, the influence of the channel fading may be not considered; and
a fifth step of going to the first step to perform the next round iterated operations.

52. The method according to claim 51, wherein:
the decoder having the reduced complexity contains a $v_n$ storage space, an $L_{m,n}$ storage space, and a (m, n) address storage space, these storage spaces are arranged in a whole block instead of being separated so as to reduce the number of the storage spaces; storage in a whole block effectively reduces the size of the occupied whole storage space; and some intermediate variables are not stored.

53. The method according to claim 51, wherein:
in the first step, the values of $V_n$ are read from the $V_n$ storage space, the values of $L_{m,n}$ are read from the $L_{m,n}$ storage space (in the initialization phase, $L_{m,n}=0$), the values of $z_{m,n}$ are calculated and obtained but not stored, which are then directly used in the second step; in which, the address parameters are read from the (m,n) address storage space, the value of the column n corresponding to the row m is calculated; when the m is sequentially stored in an order of 0, 1, 2, . . . , the hard-decision is simultaneously made for the $V_n$ to obtain a hard-decision bit which is not stored either but directly used to perform a verification whether the restriction relations are satisfied or not in the second step; for the order of $z_{m,n}$, the row order of the Parity Check matrix is firstly followed, and the column order of the Parity Check matrix is then followed;
next, the second step, the third step and the fourth step are executed, the values of $L_{m,n}$ are stored, the values of $U_n$ are not stored, and the values of $V_n$ are stored;
wherein in the second step, formulae including $$T_{m,n} = \prod_{n' \in N(m)\backslash n} \frac{1 - \exp(z_{m,n'})}{1 + \exp(z_{m,n'})} \text{ and } L_{m,n} = \ln\frac{1 - T_{m,n}}{1 + T_{m,n}},$$

being of other forms and having the same functions may be used only if the values of $L_{m,n}$ can be obtained;
as for the address sequence in executing the decoding algorithm denoted by the above first to the fifth steps, the row order of the Parity Check matrix is firstly followed, and the column order of the Parity Check matrix is then followed.

54. The method according to claim 50 or 51, wherein:
once the restriction relations are all satisfied or the maximum iteration number of times is reached, the hard-decision bits 0 or 1 are read from the $V_n$ storage space according to the sequence of the variable nodes, a sequence of these bits is outputted in any form, which are at least the decision bits of the information bit sequence; whereas the parity bit sequence is selectable to be outputted for a Turbo demodulator.

55. The method according to claim 50 or 51, wherein:
in order to save the storage spaces of the decoder, the number of columns of the Parity Check matrix is set into a power of 2 or slightly less than a power of 2.

56. A transmission system using a low density Parity Check code, the transmission system comprising a transmitting apparatus and a receiving apparatus, wherein the transmitting apparatus includes:
means for firstly inputting data sent from an information source into a low density Parity Check matrix encoder for encoding, the encoder may be an encoder using a low density Parity Check matrix constructed by using a fixed pattern, the low density Parity Check matrix including a fixed pattern sub matrix constructed by selecting a proper fixed pattern from a fixed pattern set;
means for delivering the data into a randomizer for randomizing;
means for delivering the data into an interleaver for interleaving; and
means for delivering the data through a modulator to transmit the data in air.

57. A transmission system using a low density Parity Check code, the transmission system comprising a transmitting apparatus and a receiving apparatus, wherein the receiving apparatus includes:
means for receiving a radio-frequency signal in the air, performing down-conversion and filtering, and obtaining a baseband signal;
means for delivering the baseband signal into a synchronizer to obtain a start position of the synchronization;
means for intercepting data based on the start position of the synchronization, and performing operations including channel estimation and demodulation which are finished in a demodulator;
means for delivering the outputted data into a de-interleaver to perform a de-interleaving operation;
means for delivering the outputted data into a de-randomizer to perform a de-randomizing operation;

means for delivering the outputted data into a low density Parity Check matrix decoder for decoding, the low density Parity Check matrix including a fixed pattern sub matrix constructed by selecting a proper fixed pattern from a fixed pattern set; and means for delivering the decoded data to an information sink.

* * * * *